US012563890B2

(12) United States Patent
Seong et al.

(10) Patent No.: US 12,563,890 B2
(45) Date of Patent: Feb. 24, 2026

(54) DISPLAY PANEL AND MANUFACTURING METHOD OF THE SAME

(71) Applicant: Samsung Display Co., Ltd., Yongin-si (KR)

(72) Inventors: Jaemin Seong, Suwon-si (KR); Soyun Lee, Seoul (KR); Chang-Soon Jang, Seoul (KR); Keunchan Oh, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 687 days.

(21) Appl. No.: 17/866,571

(22) Filed: Jul. 18, 2022

(65) Prior Publication Data

US 2023/0068622 A1 Mar. 2, 2023

(30) Foreign Application Priority Data

Aug. 30, 2021 (KR) ........................ 10-2021-0114615

(51) Int. Cl.
| | |
|---|---|
| *H10K 50/858* | (2023.01) |
| *H10K 59/122* | (2023.01) |
| *H10K 59/38* | (2023.01) |
| *H10K 71/00* | (2023.01) |

(52) U.S. Cl.
CPC ......... *H10K 50/858* (2023.02); *H10K 59/122* (2023.02); *H10K 59/38* (2023.02); *H10K 71/00* (2023.02)

(58) Field of Classification Search
CPC .. H10K 59/877; H10K 59/878; H10K 50/125; H10K 59/87
See application file for complete search history.

(56) References Cited

U.S. PATENT DOCUMENTS

| | | |
|---|---|---|
| 11,016,325 B2 | 5/2021 | Kwon et al. |
| 12,250,844 B2 | 3/2025 | Oh et al. |
| 2001/0005275 A1* | 6/2001 | Ikai ........................ G02F 1/153 |
| | | 359/272 |

(Continued)

FOREIGN PATENT DOCUMENTS

| | | |
|---|---|---|
| KR | 20060125266 A | 12/2006 |
| KR | 10-2020-0006206 | 1/2020 |

(Continued)

*Primary Examiner* — William B Partridge
*Assistant Examiner* — Felix B Andrews
(74) *Attorney, Agent, or Firm* — CANTOR COLBURN LLP

(57) ABSTRACT

A display panel includes a light emitting element that includes a first electrode, a light emitting layer disposed on the first electrode, and a second electrode disposed on the light emitting layer, and that outputs a source light, a light control layer disposed on the light emitting element, and that includes light control patterns, and low refractive patterns disposed on an upper portion of each of the light control patterns, wherein light control patterns include a first light control pattern and a second light control pattern spaced apart from the first light control pattern, and the low refractive patterns include a first low refractive pattern disposed on the first light control pattern and a second low refractive pattern disposed on the second light control pattern, wherein the first low refractive pattern and the second low refractive pattern are spaced apart from each other on a plane.

20 Claims, 14 Drawing Sheets

(56)     References Cited

U.S. PATENT DOCUMENTS

| | | | |
|---|---|---|---|
| 2008/0042154 A1* | 2/2008 | Wano .................. | H10K 50/854 |
| | | | 438/31 |
| 2009/0243477 A1* | 10/2009 | Saneto ................ | H10K 59/877 |
| | | | 428/323 |
| 2015/0171372 A1* | 6/2015 | Iwata .................. | H10H 20/855 |
| | | | 257/89 |
| 2016/0103249 A1* | 4/2016 | Sato ........................ | G02B 1/111 |
| | | | 428/313.9 |
| 2017/0194599 A1* | 7/2017 | Furuie ................... | H10K 50/81 |
| 2018/0164633 A1* | 6/2018 | Kashima ................ | G02F 1/137 |
| 2019/0172874 A1* | 6/2019 | Lim ....................... | H10K 59/35 |
| 2019/0369439 A1* | 12/2019 | Li ...................... | G02F 1/133514 |
| 2020/0028120 A1* | 1/2020 | Sugitani .............. | H10K 50/844 |
| 2020/0114735 A1* | 4/2020 | Tao .................. | B32B 17/10339 |
| 2021/0167310 A1* | 6/2021 | You ................... | H10K 59/8792 |

FOREIGN PATENT DOCUMENTS

| | | |
|---|---|---|
| KR | 20200083875 A | 7/2020 |
| WO | 2020226281 | 11/2020 |

* cited by examiner

NDA

PXnm

DLm

GLn

GL1

PX11

DL1

GDC

LRP-PL

BK

DP-OLED

LRP-3P

SCP

LRP-2P

CCF-G

LRP-R

LRP-1P

CCF-R

DP-OLED

LRP3

SCP

LRP2

CCF-G

LRR-R

LRP1

CCF-R

DISPLAY PANEL AND MANUFACTURING METHOD OF THE SAME

CROSS-REFERENCE TO RELATED APPLICATION

This application claims priority from and the benefit of Korean Patent Application No. 10-2021-0114615, filed on Aug. 30, 2021, which is hereby incorporated by reference for all purposes as if fully set forth herein.

BACKGROUND

Field

Embodiments of the invention relate generally to a display panel and a manufacturing method thereof and, more specifically, to a display panel with improved reliability and a method for manufacturing the same.

Discussion of the Background

A display panel includes a transmissive-type display panel that selectively transmits source light generated from a light source and a light emitting-type display panel that generates a source light from the display panel itself. In order to generate a color image, a display panel may include different kinds of light control patterns for each pixel. A light control pattern may transmit only a portion of the wavelength range of a source light, or may convert the color of the source light. Some light control patterns may change the properties of light without changing the color of a source light.

The above information disclosed in this Background section is only for understanding of the background of the inventive concepts, and, therefore, it may contain information that does not constitute prior art.

SUMMARY

Devices constructed and methods performed according to illustrative implementations of the invention are capable of improved reliability due to prevention of defects during a manufacturing process, as well as better image quality and wide angle viewing.

One or more inventive concepts provide for a display panel having improved light efficiency and image quality, and having improved reliability by preventing defects in a manufacturing process, and a method for manufacturing the same.

Additional features of the inventive concepts will be set forth in the description that follows, and in part will be apparent from the description, or may be learned by practice of the inventive concepts.

An embodiment consistent with one or more of the inventive concepts provides a display panel including a light emitting element that includes a first electrode, a light emitting layer disposed on the first electrode, and a second electrode disposed on the light emitting layer, and wherein the light emitting element outputs a source light, a light control layer disposed on the light emitting element, and that includes a plurality of light control patterns, and a plurality of low refractive patterns disposed on an upper portion of each of the plurality of light control patterns, wherein the plurality of light control patterns includes a first light control pattern and a second light control pattern spaced apart from the first light control pattern, and the plurality of low refractive patterns includes a first low refractive pattern disposed on the first light control pattern and a second low refractive pattern disposed on the second light control pattern, wherein the first low refractive pattern and the second low refractive pattern are spaced apart from each other on a plane.

In an embodiment, the width of each of the plurality of low refractive patterns on a plane may be greater than the width of each of corresponding low refractive patterns on a plane among the plurality of low refractive patterns.

In an embodiment, the width of the first low refractive pattern in one direction may be greater than the width of the first light control pattern in the one direction, and the width of the second low refractive pattern in the one direction may be greater than the width of the second light control pattern in the one direction.

In an embodiment, the light control layer may further include a bank having opening that is defined therein and in which each of the plurality of light control patterns is disposed.

In an embodiment, a bank well spaced apart from the opening on a plane may be defined in the bank.

In an embodiment, the display panel may further include a color filter layer disposed on the plurality of low refractive patterns, and including a plurality of color filters.

In an embodiment, the plurality of color filters may include a first color filter at least a portion of which overlaps the first light control pattern, and a second color filter at least a portion of which overlaps the second light control pattern.

In an embodiment, a color filter pattern containing the same material as at least one of the plurality of color filters may be disposed inside the bank well.

In an embodiment, the color filter layer may further include an overcoat layer that covers the plurality of color filters.

In an embodiment, at least a portion of the overcoat layer may be disposed inside the bank well.

In an embodiment, the light control layer may further include a transmissive pattern spaced apart from the first light control pattern and the second light control pattern on a plane, and the plurality of low refractive patterns may further include a third low refractive pattern disposed on the transmissive pattern.

In an embodiment, at least some of the plurality of light control patterns may include quantum dots.

In an embodiment, each of the plurality of low refractive patterns may include a porogen or hollow silica.

In an embodiment, each of the plurality of low refractive patterns may further include a photocuring agent.

In an embodiment, each of the plurality of low refractive patterns may have a refractive index of 1.1 to 1.4, and may have a transmittance of 90% or greater.

In an embodiment, the source light may be light of a first wavelength, the first light control pattern may convert the source light into light of a second wavelength that is different from the first wavelength, and the second light control pattern may convert the source light into light of a third wavelength that is different from the first wavelength and the second wavelength.

In an embodiment, the light of the first wavelength may be blue light, the light of the second wavelength may be green light, and the light of the third wavelength may be red light.

In an embodiment consistent with one or more of the inventive concepts, a display panel includes a light emitting element, a light control layer disposed on the light emitting element, and including a bank having a plurality of openings defined therein, and a plurality of light control patterns disposed inside each of the plurality of openings, and a plurality of low refractive patterns that are disposed on an upper portion of each of the plurality of light control patterns, and at least some of which are disposed inside the plurality of openings, wherein a bank well spaced apart from the opening on a plane is defined in the bank, and the plurality of low refractive patterns do not overlap the bank well on a plane.

In an embodiment consistent with one or more of the inventive concepts, a method for manufacturing a display panel includes preparing a light emitting element that includes a first electrode, a light emitting layer disposed on the first electrode, and a second electrode disposed on the light emitting layer, and outputs a source light, forming, on the light emitting element, a first light control pattern and a second light control pattern spaced apart from the first light control pattern, coating a low refractive material on the first light control pattern and the second light control pattern to provide a preliminary low refractive pattern layer, irradiating and curing a portion of the preliminary low refractive pattern layer that overlaps each of the first light control pattern and the second light control pattern with light, and after the curing, removing a portion that is not cured.

In an embodiment, after the removing of a portion that is not cured, a first low refractive pattern overlapping the first light control pattern on a plane, and a second low refractive pattern overlapping the second light control pattern on a plane may be formed, and the first low refractive pattern and the second low refractive pattern may be spaced apart from each other on a plane.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

FIG. 1C is a cross-sectional view of a display panel according to an embodiment.

FIG. 4 and FIG. 5 are cross-sectional views of a display panel according to an embodiment.

FIG. 6A to FIG. 6D are cross-sectional views sequentially showing some steps of a method for manufacturing a display panel according to an embodiment.

DETAILED DESCRIPTION

Figure 1A:
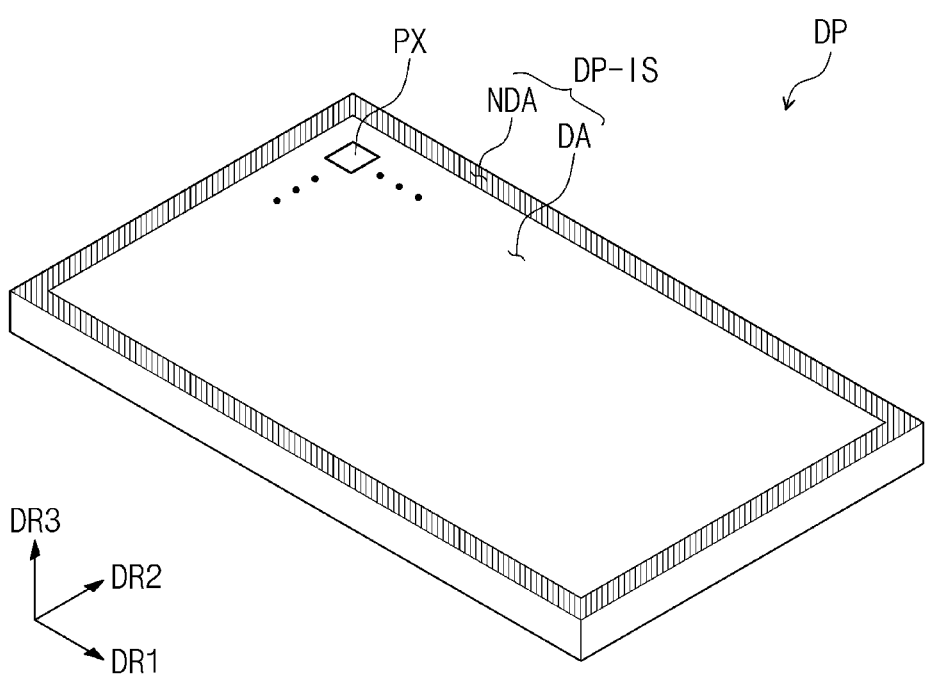
FIG. 1A is a perspective view of a display panel according to an embodiment that is constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to that this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
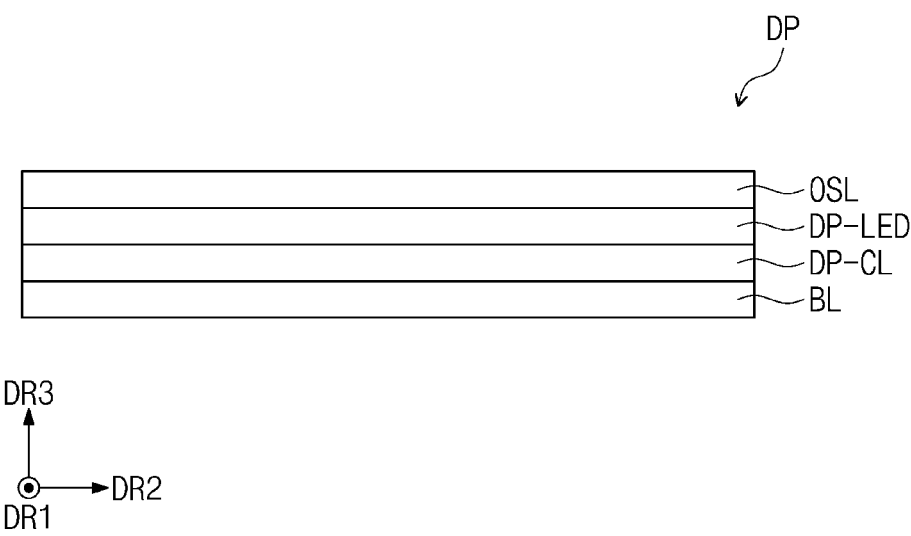
FIG. 1B is a cross-sectional view of a display panel according to an embodiment.
Figure 1C:
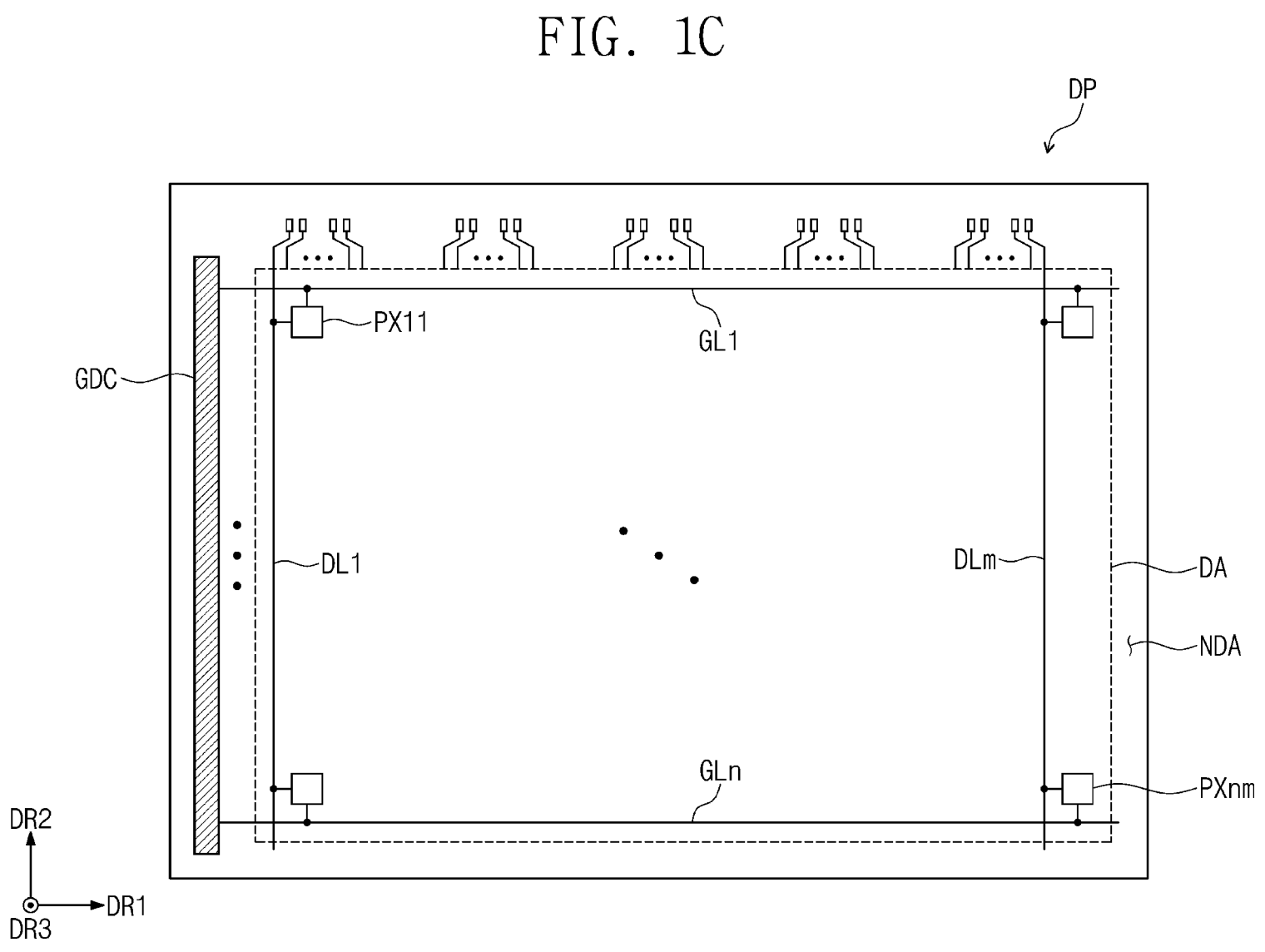

FIG. 1A is a perspective view of a display panel DP according to an embodiment that is constructed according to principles of the invention. FIG. 1B is a cross-sectional view of the display panel DP according to an embodiment. FIG. 1C is a plan view of the display panel DP according to an embodiment.

As illustrated in FIG. 1A, the display panel DP may display an image through a display surface DP-IS. The display surface DP-IS is parallel to a plane defined by a first direction DR1 and a second direction DR2. The display surface DP-IS may include a display region DA and the non-display region NDA. In the display region DA, a pixel PX is disposed, and in the non-display region NDA, the pixel PX is not disposed. The non-display region NDA is defined along the edge of the display surface DP-IS. The non-display region NDA may surround the display region DA. In an embodiment, the non-display region NDA may be omitted in some implementations of the embodiment, or may be disposed on only one side of the display region DA.

The normal direction of the display surface DP-IS, that is, the thickness direction of the display panel DP is indicated by a third direction DR3. A front surface (or an upper surface) and a back surface (or a lower surface) of each layer or unit described below are distinguished by the third direction DR3. However, the first to third directions DR1, DR2, and DR3 shown in the embodiment described herein are merely illustrative.

In an embodiment, the display panel DP provided with a planar display surface DP-IS is illustrated, but the embodiment described herein is not limited thereto. The display panel DP may include a curved display surface or a three-dimensional display surface. The three-dimensional display surface may include a plurality of display regions indicating different directions.

As illustrated in FIG. 1B, the display panel DP includes a base layer BL, a circuit element layer DP-CL, a display element layer DP-LED, and an optical structure layer OSL. The base layer BL may include a synthetic resin substrate or a glass substrate. The circuit element layer DP-CL includes at least one insulation layer and a circuit element. The circuit element includes a signal line, a driving circuit of a pixel, and the like. The circuit element layer DP-CL may be formed through a forming process of an insulation layer, a semiconductor layer, and a conductive layer by coating, deposition, and the like, and a patterning process of an insulation layer, a semiconductor layer, and a conductive layer by a photolithography process. The display element layer DP-LED includes at least a display element. The optical structure layer OSL may convert the color of light provided from the display element. The optical structure layer OSL includes a light control pattern and a structure for increasing light conversion efficiency.

FIG. 1C illustrates a planar arrangement relationship of signal lines GL1 to GLn and DL1 to DLm and pixels PX11 to PXnm. The signal lines GL1 to GLn and DL1 to DLm may include a plurality of gate lines GL1 to GLn and a plurality of data lines DL1 to DLm.

Each of the pixels PX11 to PXnm is connected to a corresponding gate line among the plurality of gate lines GL1 to GLn and a corresponding data line among the plurality of data lines DL1 to DLm. Each of the pixels PX11 to PXnm may include a pixel driving circuit and a display element. Depending on the configuration of the pixel driving circuit of each of the pixels PX11 to PXnm, more types of signal lines may be provided in the display panel DP.

The pixels PX11 to PXnm in a matrix form are illustrated in FIG. 1C, but the embodiment described herein is not limited thereto. The pixels PX11 to PXnm may be disposed in a pentile (Pentile®) form. For example, points at which the pixels PX11 to PXnm are disposed may correspond to vertices of a diamond. A gate driving circuit GDC may be integrated into the display panel DP through an oxide silicon gate driver circuit (OSG) process or an amorphous silicon gate driver circuit (ASG) process.

Figure 2A:
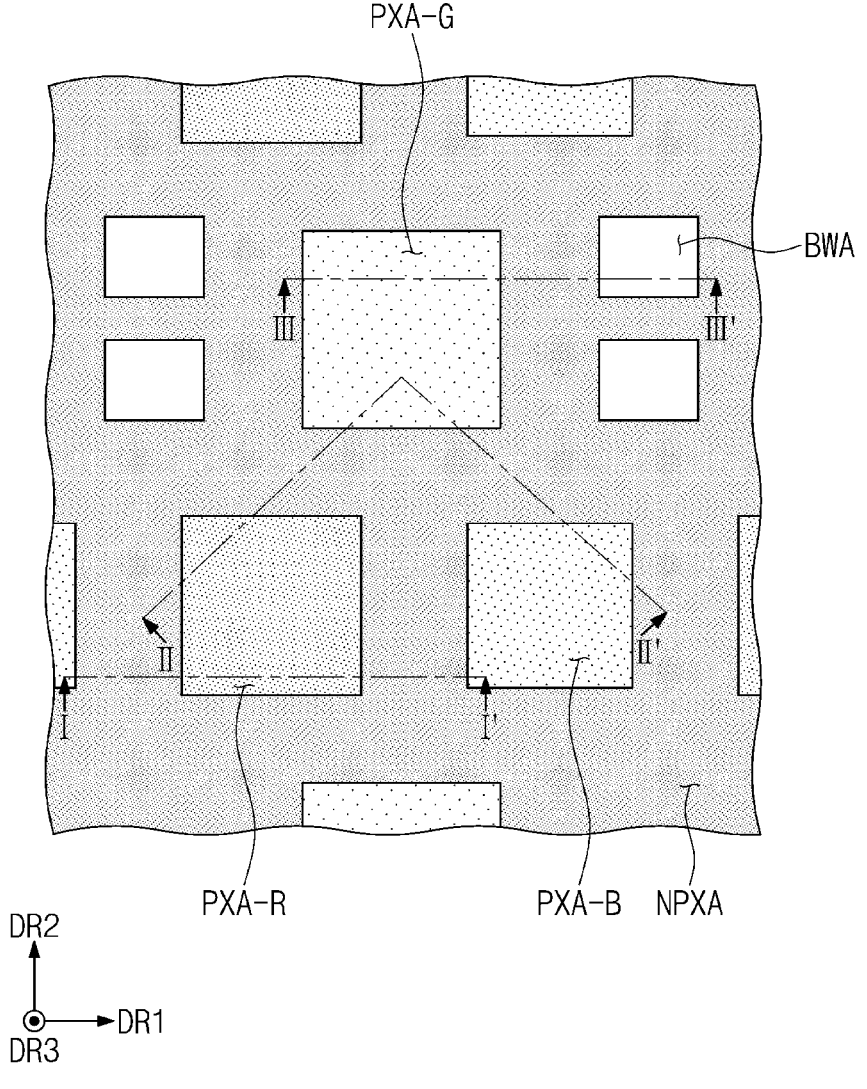
FIG. 2A and FIG. 2B are plan views of a portion of a display panel according to an embodiment.
Figure 2B:
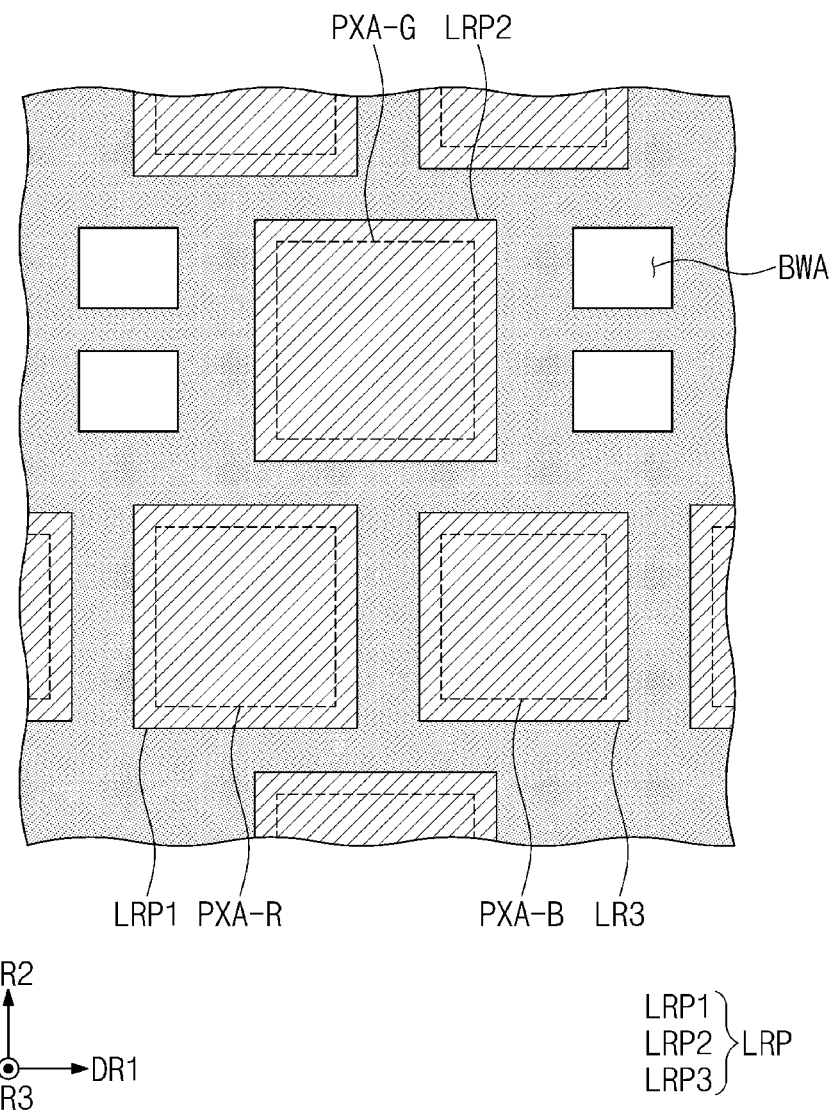

FIG. 2A and FIG. 2B are plan views of an enlarged portion of the display panel DP according to an embodiment. FIG. 2A and FIG. 2B illustrates a plane including three pixel regions PXA-R, PXA-G, and PXA-B and a bank well region BWA adjacent thereto. In the embodiment described herein, the three types of pixel regions PXA-R, PXA-G, and PXA-B illustrated in FIG. 2A may be repeatedly disposed throughout the display region DA (see FIG. 1A).

Around first to third pixel regions PXA-R, PXA-G, and PXA-B, a peripheral region NPXA is disposed. The peripheral region NPXA sets boundaries of the first to third pixel regions PXA-R, PXA-G, and PXA-B. The peripheral region NPXA may surround the first to third pixel regions PXA-R, PXA-G, and PXA-B. In the peripheral region NPXA, a structure for preventing color mixing between the first to third pixel regions PXA-R, PXA-G, and PXA-B, for example, a pixel definition film PDL (see FIG. 3A), a bank BK (see FIG. 3A), or the like may be disposed.

In FIG. 2A, first to third pixel regions PXA-R, PXA-G, and PXA-B having the same planar shape and different planar areas are illustrated. However, the embodiment described herein is not limited thereto. The areas of two or more among the first to third pixel regions PXA-R, PXA-G, and PXA-B may be the same as each other. The areas of the first to third pixel regions PXA-R, PXA-G, and PXA-B may be set according to the color of emitted light. Among primary colors, the area of a pixel region emitting red light may be the largest, and the area of a pixel region emitting blue light may be the smallest.

In FIG. 2A, first to third pixel regions PXA-R, PXA-G, and PXA-B in a rectangular shape are illustrated. However, the embodiment is not limited thereto. On a plane, the first to third pixel regions PXA-R, PXA-G, and PXA-B may have a different polygonal shape (including a substantially polygonal shape) such as a rhombic shape or a pentagonal shape. The first to third pixel regions PXA-R, PXA-G, and PXA-B may have a rectangular shape (a substantially rectangular shape) having round corner regions on a plane.

FIG. 2A illustrates that the second pixel region PXA-G is disposed in a first row and the first pixel region PXA-R and the third pixel region PXA-B are disposed in a second row, but the embodiment is not limited thereto. The disposition of the first to third pixel regions PXA-R, PXA-G, and PXA-B may be variously changed. For example, the first to third pixel regions PXA-R, PXA-G, and PXA-B may be disposed on the same row.

One among the first to third pixel regions PXA-R, PXA-G, and PXA-B provides a third color light corresponding to a source light, another thereof provides a first color light different from the third color light, and the other thereof provides a second color light different from the third color light and the first color light. In the embodiment described herein, the third pixel region PXA-B provides the third color light. In the embodiment described herein, the first pixel region PXA-R may provide red light, the second pixel region PXA-G may provide green light, and the third pixel region PXA-B may provide blue light.

In the display region DA (see FIG. 1A), a bank well region BWA may be defined. The bank well region BWA may be a region in which a bank well BW (see FIG. 5) is formed to prevent defects caused by erroneous adhesion during a process of patterning a plurality of light control patterns CCF-R, CCF-G, and SCP (see FIG. 4) included in a light control layer CCL (see FIG. 4). That is, the bank well region BWA may be a region in which the bank well BW (see FIG. 5) formed by removing a portion of the bank BK (see FIG. 5) is defined.

FIG. 2A illustrates that four bank well regions BWA are defined to be adjacent to the second pixel region PXA-G, but the embodiment described herein is not limited thereto. The disposition of the bank well region BWA may be variously changed.

Referring to FIG. 2B, the display panel DP of an embodiment includes a low refractive pattern LRP overlapping each of the first to third pixel regions PXA-R, PXA-G, and PXA-B. The low refractive pattern LRP may include a first low refractive pattern LRP1 overlapping the first pixel region PXA-R, a second low refractive pattern LRP2 overlapping the second pixel region PXA-G, and a third low refractive pattern LRP3 overlapping the third pixel region PXA-B. Each of the first low refractive pattern LRP1, the second low refractive pattern LRP2, and the third low refractive pattern LRP3 may disposed spaced apart from each other on a plane. The low refractive pattern LRP may not overlap the bank well region BWA. The low refractive pattern LRP may have a planar area larger than a planar area of each pixel region that the low refractive pattern LRP overlaps. In other words, the first low refractive pattern LRP1 may have a planar area larger than a planar area of the first pixel region PXA-R, the second low refractive pattern LRP2 may have a planar area larger than a planar area of the second pixel region PXA-G, and the third low refractive pattern LRP3 may have a planar area larger than a planar area of the third pixel region PXA-B. Hereinafter, the low refractive pattern LRP will be described in detail later.

Figure 3A:
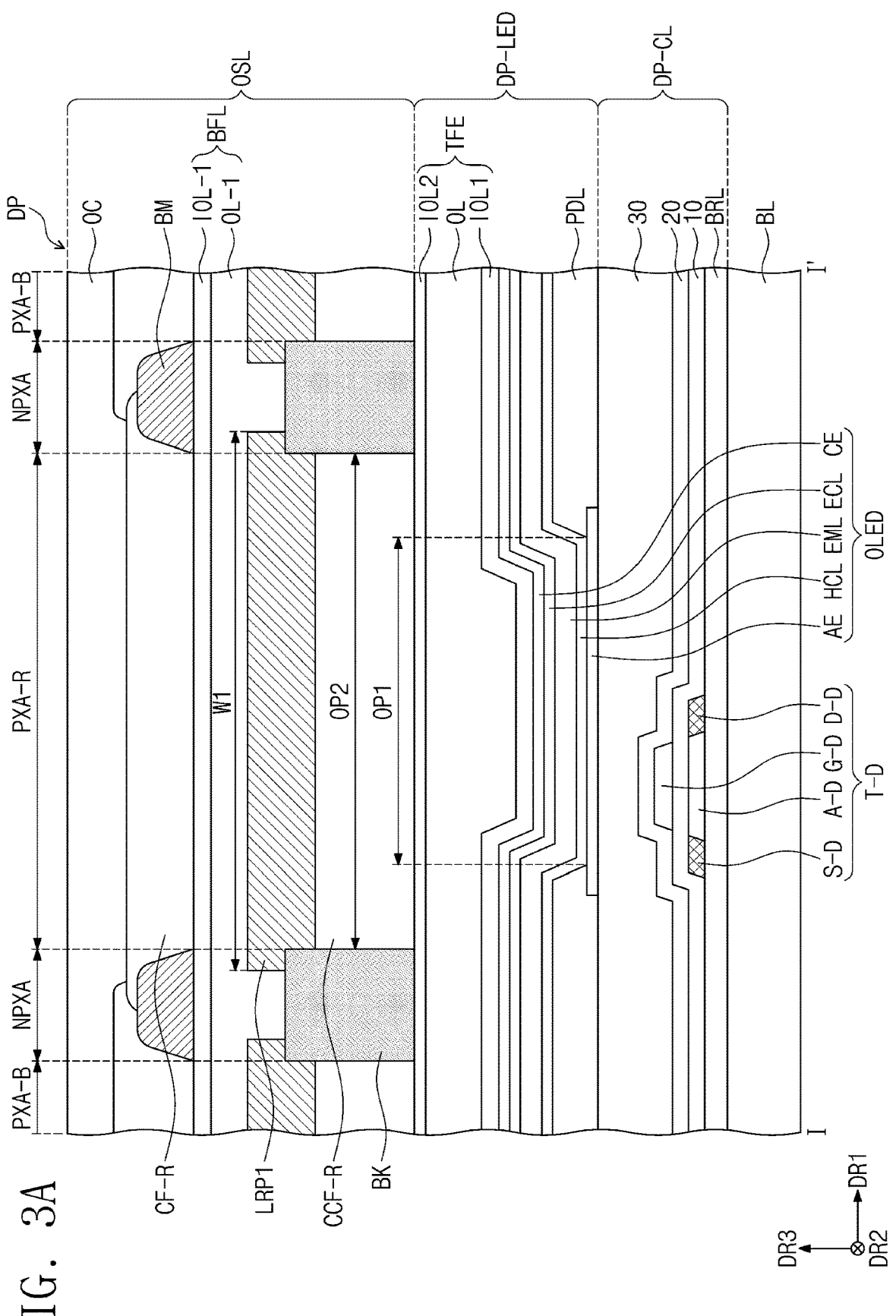
FIG. 3A to FIG. 3C are each a cross-sectional view of a display panel according to an embodiment.
Figure 3B:
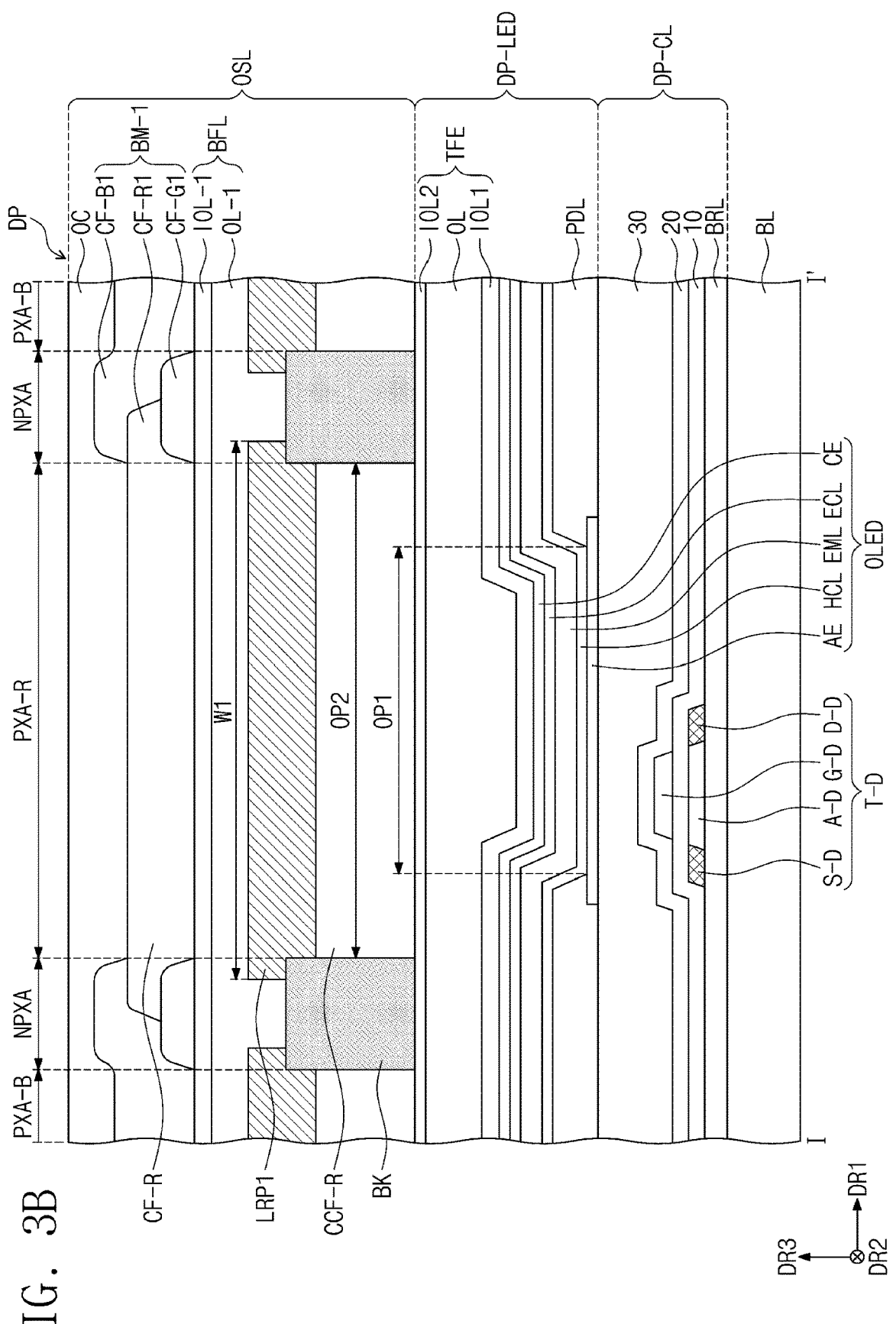
Figure 3C:
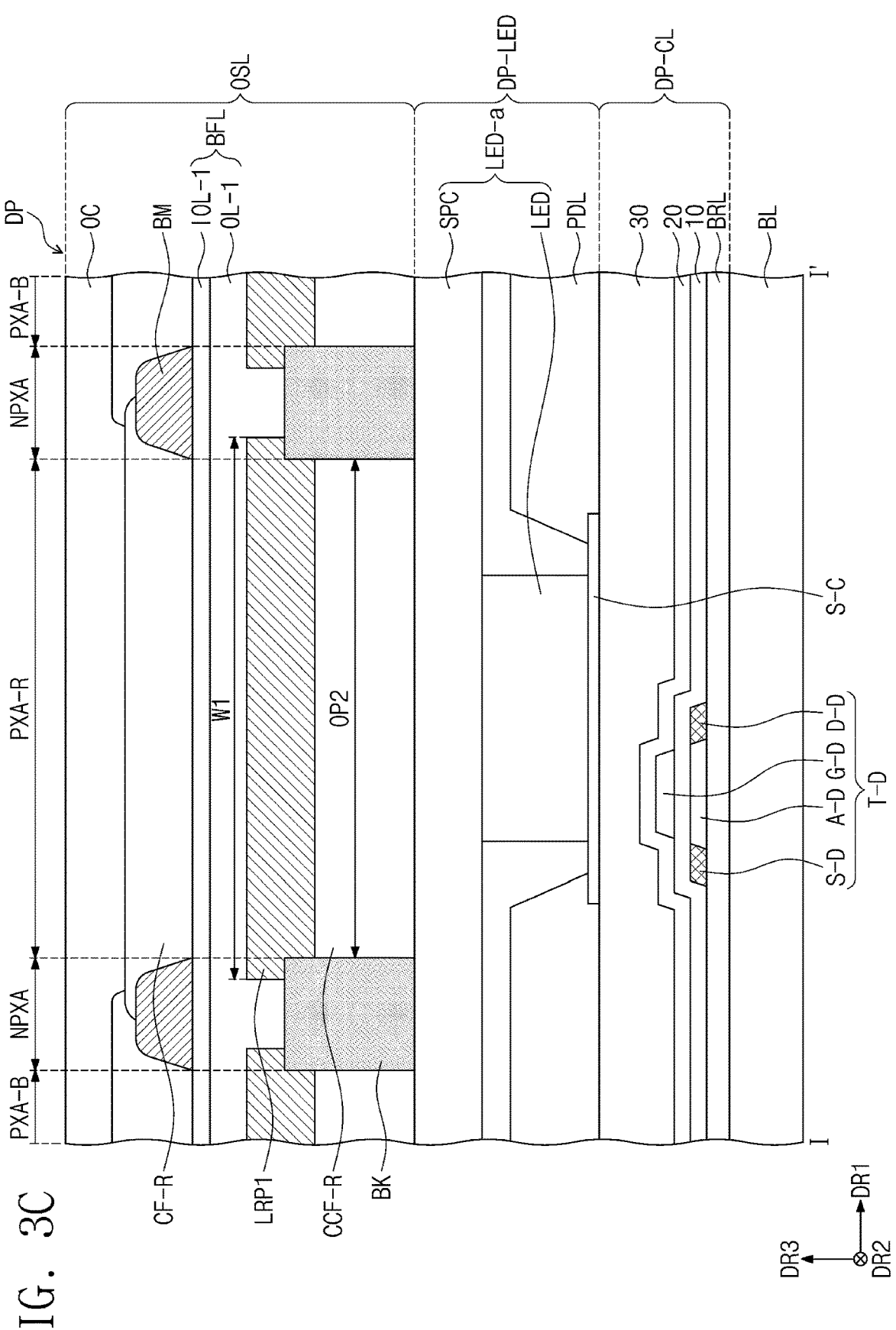
Figure 3D:
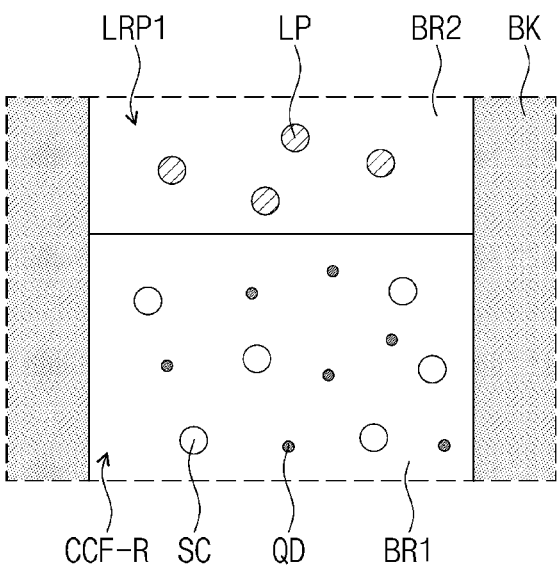
FIG. 3D is a cross-sectional view of a portion of a cross-section of a display panel according to an embodiment.

FIG. 3A and FIG. 3B are each a cross-sectional view of the display panel DP according to an embodiment. FIG. 3D illustrates an enlarged region of a cross-section of the display panel DP according to an embodiment. FIG. 3A to FIG. 3C each illustrates a cross-section corresponding to I-I' of FIG. 2A. FIG. 3D illustrates a portion of the bank BK, the light control pattern CCF-R, and the low refractive pattern LRP1 of FIG. 3A in more detail.

Referring to FIG. 3A, the circuit element layer DP-CL may include a transistor T-D as a circuit element. According to the design of a driving circuit of the pixel PX (see FIG. 1A), the configuration of the circuit element layer DP-CL may vary, and FIG. 3A illustrates one transistor T-D. The disposition relationship of an active A-D, a source S-D, a drain D-D, and a gate G-D constituting the transistor T-D is illustrated. The active A-D, the source S-D, and the drain D-D may be regions distinguished according to the doping concentration or conductivity of a semiconductor pattern.

The circuit element layer DP-CL may include a lower buffer layer BRL, a first insulation layer 10, a second insulation layer 20, and a third insulation layer 30 disposed on the base layer BL. For example, the lower buffer layer BRL, the first insulation layer 10, and the second insulation layer 20 may be an inorganic layer, and the third insulation layer 30 may be an organic layer.

The display element layer DP-LED may include a light emitting element OLED as a display element. The light emitting element OLED may generate the source light described above. The light emitting element OLED includes a first electrode AE, a second electrode CE, and a light emitting layer EML disposed therebetween. In the embodiment described herein, the display element layer DP-LED may include an organic light emitting diode as a light emitting element. In an embodiment, a light emitting element may include a quantum dot light emitting diode. That is, the light emitting layer EML included in the light emitting element OLED may include an organic light emitting material as a light emitting material, or the light emitting layer EML may include a quantum dot material as the light emitting material. Alternatively, in the embodiment described herein, the display element layer DP-LED may include, as a light emitting element, an ultra-small light emitting element LED (see FIG. 3C) to be described later. The ultra-small light emitting element may include, for example, a micro-LED element and/or a nano-LED element.

The display element layer DP-LED includes the pixel definition film PDL. For example, the pixel definition film PDL may be an organic layer.

On the third insulation layer 30, the first electrode AE is disposed. The first electrode AE may be directly or indirectly connected to the transistor T-D. On the pixel definition film PDL, a first opening OP1 is defined. The first opening OP1 of the pixel definition film PDL exposes at least a portion of the first electrode AE. In the present embodiment, the first opening OP1 defines the pixel region PXA-R.

A hole control layer HCL, the light emitting layer EML, and an electron control layer ECL overlap at least the pixel region PXA-R. The hole control layer HCL, the light emitting layer EML, the electron control layer ECL, and the second electrode CE may be commonly disposed in the first to third pixel regions PXA-R, PXA-G, and PXA-B (see FIG. 2A). Each of the hole control layer HCL, the light emitting layer EML, the electron control layer ECL, and the second electrode CE that overlap the first to third pixel regions PXA-R, PXA-G, and PXA-B may have a single body shape. However, the embodiment described herein is not limited thereto. At least one among the hole control layer HCL, the light emitting layer EML, and the electron control layer ECL may be separated and formed for each of the first to third pixel regions PXA-R, PXA-G, and PXA-B.

The hole control layer HCL includes a hole transport layer, and may further include a hole injection layer. The light emitting layer EML may generate blue light, which is a source light. The blue light may include light having a wavelength of 410 nm to 480 nm. The light emission spectrum of the blue light may have a maximum peak between 440 nm to 460 nm. The electron control layer ECL includes an electron transport layer, and may further include an electron injection layer.

The display element layer DP-LED may include a thin film encapsulation layer TFE that protects the second electrode CE. The thin film encapsulation layer TFE may include an organic matter or an inorganic matter. The thin film encapsulation layer TFE may have a multi-layered structure in which an inorganic layer/organic layer are repeated. In the present embodiment, the thin film encapsulation layer TFE may include a first encapsulation inorganic layer IOL1/an encapsulation organic layer O1/a second encapsulation inorganic layer IOL2. The first and second encapsulation inorganic layers IOL1/IOL2 may protect the light emitting element OLED from external moisture, and the encapsulation organic layer OL may prevent imprint defects of the light emitting element OLED caused by foreign substances introduced during a manufacturing process. The display panel DP may further include a refractive index control layer for improving light emitting efficiency on an upper side of the thin film encapsulation layer TFE.

As shown in FIG. 3A, on the thin film encapsulation layer TFE, the optical structure layer OSL is disposed. The optical structure layer OSL includes the bank BK, the light control pattern CCF-R, a buffer layer BFL, a color filter CF-R, a light blocking pattern BM, and an overcoat layer OC.

The bank BK may include a base resin and an additive. The base resin may be formed of various resin compositions that may be commonly referred to as a binder. The additive may include a coupling agent and/or a photo initiator. The additive may further include a dispersing agent.

The bank BK may include a black coloring agent for blocking light. The bank BK may include a black dye and a black pigment mixed in the base resin. In an embodiment, the black coloring agent may include carbon black, or may include a metal such as chromium or an oxide thereof.

The bank BK includes a second opening OP2 corresponding to the first opening OP1. On a plane, the second opening OP2 overlaps the first opening OP1, and has a larger area than the first opening OP1.

On the inside of the second opening OP2, the light control pattern CCF-R is disposed. The light control pattern CCF-R may change optical properties of a source light. The light control pattern CCF-R may include a quantum dot for changing the optical properties of a source light.

In the embodiment described herein, the light control pattern CCF-R may be formed by an ink-jet process. A liquid composition is provided in the second opening OP2. A composition polymerized by a thermal curing process or photocuring process has a reduced volume after curing.

A step may be generated between an upper surface of the bank BK and an upper surface of the light control pattern CCF-R. That is, the upper surface of the bank BK may be defined to be higher than the upper surface of the light control pattern CCF-R. The height difference between the upper surface of the bank BK and the upper surface of the light control pattern CCF-R may be, for example, about 2 μm to about 3 μm.

On the light control pattern CCF-R, the low refractive pattern LRP1 is disposed. The low refractive pattern LRP1 may totally reflect light emitted at a high angle among light emitted to an upper portion of the light control pattern CCF-R so as to be recycled to enter the light control pattern CCF-R again. The optical properties of light totally reflected by the low refractive pattern LRP1 and re-entered the light control pattern CCF-R may be changed again through a quantum dot and the like included in the light control pattern CCF-R, and accordingly, the light conversion efficiency of the light control pattern CCF-R may be improved. The low refractive pattern LRP1 may cover the entire upper surface of the light control pattern CCF-R.

The low refractive pattern LRP1 has a low refractive index. In an embodiment, the low refractive pattern LRP1 may have a refractive index of about 1.1 to about 1.4. As the low refractive pattern LRP1 has a low refractive index of about 1.1 to about 1.4, light of a high angle emitted to the upper portion of the light control pattern CCF-R may be totally reflected, effectively. The low refractive pattern LRP1 may have a high transmittance so as not to interfere with the progress of light emitted upward from the light control pattern CCF-R. The low refractive pattern LRP1 may have a high transmittance of 90% or higher.

At least a portion of the low refractive pattern LRP1 may be disposed on the upper surface of the bank BK. A step may be generated between an upper surface of the low refractive pattern LRP1 and the upper surface of the bank BK. That is, the upper surface of the low refractive pattern LRP1 may be defined to be higher than the upper surface of the bank BK. The height difference between the upper surface of the bank BK and the upper surface of the low refractive pattern LRP1 may be, for example, about 1 μm to about 2 μm.

On the first direction DR1, a width W1 of the low refractive pattern LRP1 may be greater than a width of the second opening OP2. Accordingly, on the first direction DR1, the width W1 of the low refractive pattern LRP1 may be greater than a width of the light control pattern CCF-R disposed inside the second opening OP2. As the width W1 of the low refractive pattern LRP1 is designed to be greater than the width of the light control pattern CCF-R, the low refractive pattern LRP1 may cover the entire upper surface of the light control pattern CCF-R even when there is a bit of misalignment during a forming process of the low refractive pattern LRP1, and thus, the reliability of the display panel DP may be improved.

On the bank BK and the low refractive pattern LRP1, the buffer layer BFL at least a portion of which overlaps the light control pattern CCF-R is disposed. The buffer layer BFL may include an organic buffer layer OL-1 and an inorganic buffer layer IOL-1. FIG. 3A illustrates that the buffer layer BFL includes one organic buffer layer OL-1 and one inorganic buffer layer IOL-1, but the embodiment described herein is not limited thereto. The organic buffer layer OL-1 and the inorganic buffer layer IOL-1 may be provided in plurality. For example, the buffer layer BFL may have a shape in which one organic buffer layer is disposed between two inorganic buffer layers. Alternatively, the inorganic buffer layer IOL-1 may be omitted in some implementations of the embodiment.

The inorganic buffer layer IOL-1 protects the light control pattern CCF-R from external moisture, and the organic buffer layer OL-1 removes steps defined by the bank BK and the low refractive pattern LRP1, and provides a flat base surface to a member to be disposed on an upper side. The inorganic buffer layer IOL-1 may include any one or more of silicon oxide, silicon oxynitride, and silicon nitride. The organic buffer layer OL-1 may include an organic material, for example, an acrylic organic material.

On the buffer layer BFL, the color filter CF-R is disposed. The color filter CF-R transmits light of a specific wavelength range, and blocks light of a wavelength range other than the corresponding wavelength range. The color filter CF-R of the first pixel region PXA-R may transmit red light, and may block green light and blue light.

The color filter CF-R includes a base resin and a dye and/or a pigment dispersed in the base resin. The base resin is a medium in which a dye and/or a pigment is dispersed, and may be formed of various resin compositions that may be commonly referred to as a binder.

The color filter CF-R disposed on a flat surface with steps removed by the organic buffer layer OL-1 may have a uniform thickness in the first pixel region PXA-R. Light converted into red light from blue light, which is a source light, through the light control pattern CCF-R may be provided to the outside with uniform luminance in the first pixel region PXA-R.

Between color filters disposed in each pixel, the light blocking pattern BM may be disposed. The light blocking pattern BM may be disposed to overlap the peripheral region NPXA. A material constituting the light blocking pattern BM is not particularly limited as long as it is a material that absorbs light. The light blocking pattern BM is a layer having a black color, and in an embodiment, the light blocking pattern BM may include a black coloring agent. The black coloring agent may include a black dye and a black pigment. The black coloring agent may include carbon black, a metal such as chromium, or an oxide thereof. Alternatively, the light blocking pattern BM may have a shape in which a plurality of color filter parts are stacked as to be described later with reference to FIG. 3A. On the color filter CF-R, the overcoat layer OC is disposed. The overcoat layer OC may be an organic layer that protects the color filter CF-R. The overcoat layer OC may include a photo-curable organic material or thermo-curable organic material. However, the embodiment described herein is not limited thereto. The overcoat layer OC may include an inorganic material.

The overcoat layer OC may cover the color filter CF-R, and planarize an upper surface of the color filter CF-R. In an embodiment, on the overcoat layer OC, a protective glass substrate may be further disposed, and between the overcoat layer OC and the glass substrate, an adhesive layer may be disposed.

Referring to FIG. 3B, in the embodiment described herein, a light blocking pattern BM-1 disposed between color filters disposed in each pixel may include a structure in which a plurality of color filter parts CF-G1, CF-R1, and CF-B1 are stacked. In the light blocking pattern BM-1, two or more color filters CF-G1, CF-R1, and CF-B1 that absorb light of different wavelengths may be stacked to block light. FIG. 3B illustrates that the light blocking pattern BM-1 disposed in the peripheral region NPXA includes three layers of color filter parts CF-G1, CF-R1, and CF-B1, but the embodiment described herein is not limited thereto. The light blocking pattern BM-1 may be one in which two different layers of color filters are stacked.

Referring to FIG. 3C, in the embodiment described herein, the display element layer DP-LED may include, as a light emitting element, an ultra-small light emitting element LED. The ultra-small light emitting element LED may include, for example, a micro-LED element and/or a nano-LED element.

The ultra-small light emitting element LED may be mounted on a transparent substrate SPC, and constitute a light emitting element array LED-a. The transparent substrate SPC may include a material having light-transmitting properties, for example, any one of sapphire, GaN, ZnO, and AlO. The transparent substrate SPC is a substrate suitable for mounting a micro-LED on a layer, and may be formed of a carrier wafer. The transparent substrate SPC may be a conductive substrate or insulating substrate. In an embodiment, the transparent substrate SPC may be omitted in some implementations of the embodiment.

The ultra-small light emitting element LED may be electrically connected to a contact electrode S-C disposed on the circuit element layer DP-CL. The contact electrode S-C may be directly or indirectly connected to the transistor T-D, and in FIG. 3C.

The ultra-small light emitting element LED may be a light emitting element including a plurality of semiconductor layers and an active layer. The active layer may be disposed between the semiconductor layers provided in plurality. The ultra-small light emitting element LED may further include an insulation film that covers side portions of the plurality of semiconductor layers and the active layer.

The plurality of semiconductor layers may include an n-type semiconductor layer provided by doping a semiconductor layer with an n-type dopant, and a p-type semiconductor layer provided by doping a semiconductor layer with a p-type dopant. The semiconductor layer may contain a semiconductor material, and the semiconductor material may be any one of GaN, AlN, AlGaN, InGaN, InN, InAlGaN, or AlInN, but is not limited thereto. The n-type dopant may be any one of silicon (Si), germanium (Ge), tin (Sn), selenium (Se), tellurium (Te), or a combination thereof, but is not limited thereto. The p-type dopant may be any one of magnesium (Mg), zinc (Zn), calcium (Ca), strontium (Sr), barium (Ba), or a combination thereof, but is not limited thereto. The active layer may be formed of at least one of a single quantum well structure, a multiple quantum well structure, a quantum wire structure, or a quantum dot structure. The active layer may be a region in which electrons injected through the n-type semiconductor layer and holes injected through the p-type semiconductor layer are recombined. The active layer may be a layer that emits light having energy determined by a material-specific energy band.

The length and width of the ultra-small light emitting element LED may be between several nanometers to several hundreds of micrometers. The length and width of the ultra-small light emitting element LED may be, for example, between 100 nanometers to 100 of micrometers. The ratio of length to width of the ultra-small light emitting element LED, that is, an aspect ratio, may be between 1:1 and 1:10.

Referring to FIG. 3D, as described above, the light control pattern CCF-R may include a quantum dot QD that converts a source light into light of a different wavelength. In the light control pattern CCF-R overlapping the first pixel region PXA-R (see FIG. 3A), the quantum dot QD may convert blue light, which is a source light, into red light.

The quantum dot QD may have a core-shell structure, and the core of the quantum dot QD may be selected from a Group II-VI compound, a Group III-VI compound, a Group I-III-VI compound, a Group III-V compound, a Group IV-VI compound, a Group IV element, a Group IV compound, and a combination thereof.

The Group II-VI compound may be selected from the group consisting of a binary compound selected from the group consisting of CdSe, CdTe, CdS, ZnS, ZnSe, ZnTe, ZnO, HgS, HgSe, HgTe, MgSe, MgS, and a mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-VI compound may include a binary compound such as $In_2S_3$, $In_2Se_3$, and the like, a ternary compound such as $InGaS_3$, $InGaSe_3$, and the like, or any combination thereof.

The Group I-III-VI compound may be selected from the group consisting of a ternary compound selected from the group consisting of AgInS, $AgInS_2$, CuInS, $CuInS_2$, $AgGaS_2$, $CuGaS_2$ $CuGaO_2$, $AgGaO_2$, $AgAlO_2$, and a mixture thereof, and a quaternary compound such as $AgInGaS_2$, $CuInGaS_2$, and the like.

The Group III-V compound may be selected from the group consisting of a binary compound selected from the group consisting of GaN, GaP, GaAs, GaSb, AlN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The Group III-V compound may further include a Group II metal. For example, InZnP or the like may be selected as the Group III-II-V compound.

The Group IV-VI compound may be selected from the group consisting of a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbSTe, SnPbS, SnPbSe, SnPbTe, and a mixture thereof, and a quaternary compound selected from the group consisting of SnPbSSe, SnPbSeTe, SnPbSTe, and a mixture thereof. The Group IV element may be selected from the group consisting of Si, Ge, and a mixture thereof. The Group IV compound may be a binary compound selected from the group consisting of SiC, SiGe, and a mixture thereof.

A binary compound, a ternary compound, or a quaternary compound may be present in a particle with a uniform concentration distribution, or may be present in the same particle with a partially different concentration. In addition, the quantum dot QD may have a core-shell structure in which one quantum dot surrounds another quantum dot. In the core-shell structure, the concentration of an element present in the shell may have a concentration gradient that becomes lower toward the core.

In some embodiments, a quantum dot may have a core-shell structure including a core having nano-crystals and a shell surrounding the core that are described above. The shell of the quantum dot may serve as a protection layer to prevent the chemical deformation of the core so as to maintain semiconductor properties, and/or a charging layer to impart electrophoresis properties to the quantum dot. The shell may be a single layer or multiple layers. An example of the shell of the quantum dot may be a metal or non-metal oxide, a semiconductor compound, or a combination thereof.

For example, the metal or non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO, or a ternary compound such as $MgAl_2O_4$, $CoFe_2O_4$, $NiFe_2O_4$, and $CoMn_2O_4$. However, the embodiment described herein is not limited thereto.

Also, the semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or the like. However, the embodiment described herein is not limited thereto.

The quantum dot QD may have a full width of half maximum (FWHM) of a light emission wavelength spectrum of about 45 nm or less, preferably about 40 nm or less, more preferably about 30 nm or less, and color purity or color reproducibility may be improved in the above range. In addition, light emitted through the quantum dot QD is emitted in all directions, so that a wide viewing angle may be improved.

In addition, although the form of the quantum dot QD is not particularly limited to a form commonly used in the art, a quantum dot in the form of, more specifically, spherical, pyramidal, multi-arm, or cubic nanoparticles, nanotubes, nanowires, nanofibers, nanoplate particles, and the like may be used.

The quantum dot QD may control the color of emitted light according to the particle size thereof. Accordingly, the quantum dot QD may have various light emission colors such as blue, red, green, and the like. In an embodiment, the quantum dot QD included in the light control pattern CCF-R overlapping the first pixel region PXA-R (see FIG. 3A) may have a red light emission color. The smaller the particle size of the quantum dot QD, light of the shorter wavelength region may be emitted. For example, in the quantum dots QD having the same core, the particle size of a quantum dot emitting green light may be smaller than the particle size of a quantum dot emitting red light. In addition, in the quantum dots QD having the same core, the particle size of a quantum dot emitting blue light may be smaller than the particle size of a quantum dot emitting green light. However, the embodiment is not limited thereto. Even in the quantum dots QD having the same core, the size of a particle may be controlled according to materials for forming a shell and the thickness of the shell.

When the quantum dots QD have various light emission colors such as blue, red, green, and the like, the quantum dots QD having different light emission colors may have different core materials from each other.

The light control pattern CCF-R may further include a scattering body SC. The light control pattern CCF-R may include the quantum dot QD that converts blue light into red light, and the scattering body SC that scatters light.

The scattering body SC may be an inorganic particle. For example, the scattering body SC may include at least one of $TiO_2$, ZnO, $Al_2O_3$, $SiO_2$, or hollow silica. The scattering body SC may include any one of $TiO_2$, ZnO, $Al_2O_3$, $SiO_2$, and hollow silica, or may be a mixture of two or more materials selected from $TiO_2$, ZnO, $Al_2O_3$, $SiO_2$, and hollow silica.

The light control pattern CCF-R may include a base resin BR1 that disperses the quantum dot QD and the scattering body SC. The base resin BR1 is a medium in which the quantum dot QD and the scattering body SC are dispersed, and may be formed of various resin compositions that may be generally referred to as a binder. For example, the base resin BR1 may be an acrylic resin, a urethane-based resin, a silicone-based resin, an epoxy-based resin, or the like. The base resin BR1 may be a transparent resin.

The low refractive pattern LRP1 may include optical particles LP, and a low refractive base resin BR2 that disperses the optical particles LP.

The optical particles LP may be particles for lowering the refractive index of the low refractive pattern LRP1. The optical particles LP may include, for example, a porogen or hollow silica. As the low refractive pattern LRP1 includes a porous material and the like such as a porogen or hollow silica, the refractive index of the low refractive pattern LRP1 may be as low as 1.1 to 1.4.

The low refractive pattern LRP1 may include the low refractive base resin BR2 that disperses the optical particles LP, and the low refractive base resin BR2 may be selected without limitation as long as it is a medium that allows the refractive index range of the low refractive pattern LRP1 to be 1.1 to 1.4, and the transmittance of the low refractive pattern LRP1 to be 90% or higher. The low refractive base resin BR2 may be an acrylic resin, a urethane-based resin, a silicone-based resin, an epoxy-based resin, or the like. The low refractive base resin BR2 may be the same as or different from the base resin BR1.

The low refractive pattern LRP1 may be formed through a photocuring process. The low refractive pattern LRP1 may further include a photo initiator that triggers a photocuring cross-linking chain reaction in response to ultraviolet light.

Figure 4:
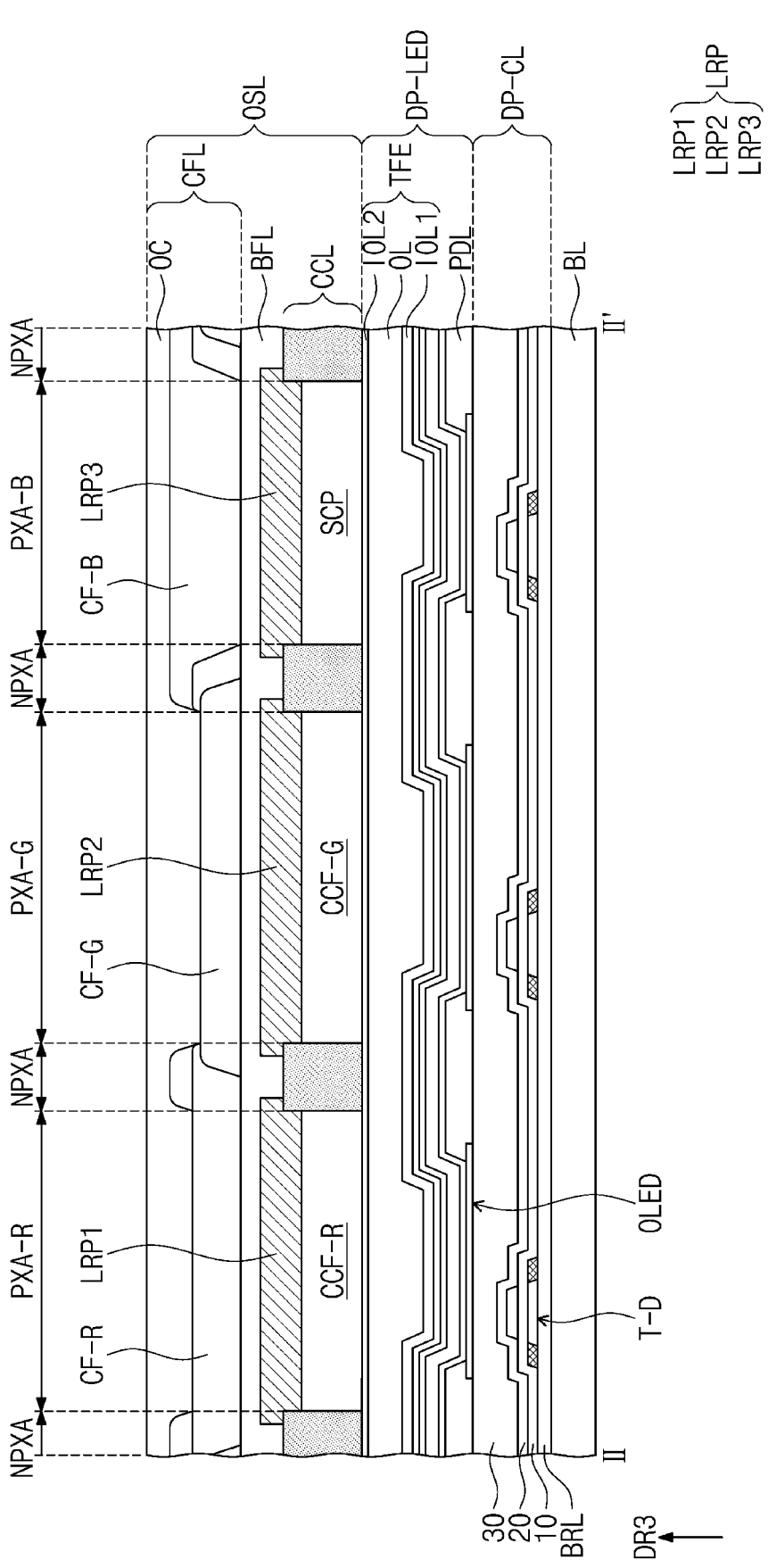
Figure 5:
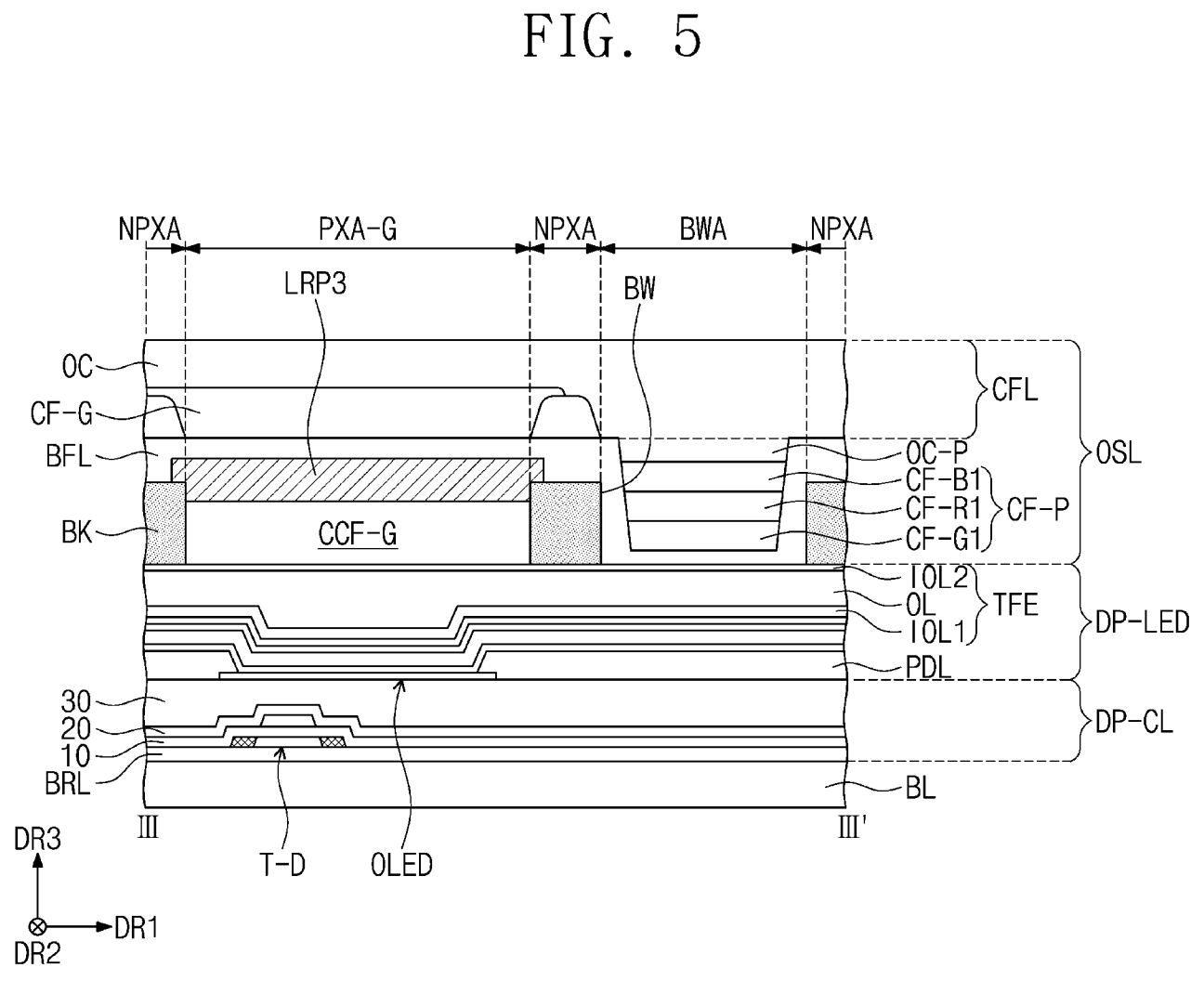

FIG. 4 and FIG. 5 are cross-sectional views of the display panel DP according to an embodiment. FIG. 4 illustrates a cross-section corresponding to II-II' of FIG. 2A. FIG. 5 illustrates a cross-section corresponding to III-III' of FIG. 2A.

Referring to FIG. 4, the circuit element layer DP-CL may include the transistor T-D as a circuit element, and the transistor T-D may correspond to each light emitting element OLED.

The circuit element layer DP-CL may include the lower buffer layer BRL, the first insulation layer 10, the second insulation layer 20, and the third insulation layer 30 disposed on the base layer BL. For example, the lower buffer layer BRL, the first insulation layer 10, and the second insulation layer 20 may be an inorganic layer, and the third insulation layer 30 may be an organic layer.

The display element layer DP-LED may include the light emitting element OLED as a display element. The light emitting element OLED may generate the source light described above, and may include the light emitting layer EML (see FIG. 3A) disposed to overlap the first pixel region PXA-R, the second pixel region PXA-G, and the third pixel region PXA-B overall. The light emitting element OLED may overlap at least each of the first pixel region PXA-R, the second pixel region PXA-G, and the third pixel region PXA-B.

The display element layer DP-LED includes the pixel definition film PDL. For example, the pixel definition film PDL may be an organic layer. At least a portion of the light emitting element OLED may be disposed in an opening defined on the pixel definition film PDL.

The display element layer DP-LED may include the thin film encapsulation layer TFE disposed on an upper portion of the light emitting element OLED. The thin film encapsulation layer TFE may include the first encapsulation inorganic layer IOL1/the encapsulation organic layer O1/the second encapsulation inorganic layer IOL2 sequentially stacked.

On the thin film encapsulation layer TFE, the optical structure layer OSL is disposed. The optical structure layer OSL includes the light control layer CCL, the buffer layer BFL, and a color filter layer CFL.

The light control layer CCL includes the above-described bank BK, and the plurality of light control patterns CCF-R, CCF-G, and SCP disposed in the second opening OP2 (see FIG. 3A) defined in the bank BK. The light control patterns CCF-R, CCF-G, and SCP may include a first light control pattern CCF-R overlapping the first pixel region PXA-R, a second light control pattern CCF-G overlapping the second pixel region PXA-G, and a third light control pattern SCP overlapping the third pixel region PXA-B. The third light control pattern SCP may be referred to as a transmissive pattern.

The plurality of light control patterns CCF-R, CCF-G, and SCP are disposed in the second opening OP2 (see FIG. 3A) defined in the bank BK, and at least some of the plurality of light control patterns CCF-R, CCF-G, and SCP may change the optical properties of the source light.

In an embodiment, the first light control pattern CCF-R may convert blue light, which is the source light, into red light. The second light control pattern CCF-G may convert blue light, which is the source light, into green light. The transmissive pattern SCP may transmit blue light, which is the source light. In the embodiment described herein, the blue light may include light having a wavelength of 410 nm to 480 nm, the red light may include light having a wavelength of 620 nm to 750 nm, and the green light may include light having a wavelength of 500 nm to 570 nm.

The first light control pattern CCF-R and the second light control pattern CCF-G may include the quantum dot QD (see FIG. 3D) and the scattering body SC (see FIG. 3D) described above, and the transmissive pattern SCP may include only the scattering body SC (see FIG. 3D) without including a quantum dot. The quantum dot QD (see FIG. 3D) included in the first light control pattern CCF-R may be a particle that converts blue light, which is a source light, into red light, and the quantum dot QD included in the second light control pattern CCF-G may be a particle that converts blue light, which is the source light, into green light.

On an upper portion of each of the plurality of light control patterns CCF-R, CCF-G, and SCP, the low refractive pattern LRP is disposed. The low refractive pattern LRP may totally reflect light emitted at a high angle among light emitted to the upper portion of each of the plurality of light control patterns CCF-R, CCF-G, and SCP so as to be recycled, and the light conversion efficiency of each of the plurality of light controls patterns CCF-R, CCF-G, and SCP may be improved by the low refractive pattern LRP. The low refractive pattern LRP may cover the entire upper surface of each of the plurality of light control patterns CCF-R, CCF-G, and SCP.

The low refractive pattern LRP may include the first low refractive pattern LRP1 overlapping the first pixel region PXA-R, the second low refractive pattern LRP2 overlapping the second pixel region PXA-G, and the third low refractive pattern LRP3 overlapping the third pixel region PXA-B. The first low refractive pattern LRP1 overlaps the first light control pattern CCF-R on a plane, and may cover an upper surface of the first light control pattern CCF-R. The second low refractive pattern LRP2 overlaps the second light control pattern CCF-G a plane, and may cover an upper surface of the second light control pattern CCF-G. The third low refractive pattern LRP3 overlaps the transmissive pattern SCP a plane, and may cover an upper surface of the transmissive pattern SCP.

At least a portion of each of the first low refractive pattern LRP1, the second low refractive pattern LRP2, and the third low refractive pattern LRP3 may be disposed on the upper surface of the bank BK. An upper surface of each of the first low refractive pattern LRP1, the second low refractive pattern LRP2, and the third low refractive pattern LRP3 may be defined higher than the upper surface of the bank BK.

On one direction, a width of the low refractive pattern LRP may be greater than a width of each of the light control patterns CCF-R, CCF-G, and SCP. That is, on one direction, the width of the first low refractive pattern LRP1 may be greater than the width of the first light control pattern CCF-R, the width of the second low refractive pattern LRP2 may be greater than the width of the second light control pattern CCF-G, and the width of the third low refractive pattern LRP3 may be greater than the width of the transmissive pattern SCP. As the width of the low refractive pattern LRP is designed to be greater than the width of each of the corresponding light control patterns CCF-R, CCF-G, and SCP, the low refractive pattern LRP may cover the entire upper surface of each of the light control pattern CCF-R, CCF-G, and SCP even when there is a bit of misalignment during a forming process of the low refractive pattern LRP, and thus, the reliability of the display panel DP may be improved.

Each of the first low refractive pattern LRP1, the second low refractive pattern LRP2, and the third low refractive pattern LRP3 may disposed spaced apart from each other on a plane. That is, each of the first low refractive pattern LRP1, the second low refractive pattern LRP2, and the third low refractive pattern LRP3 may be disposed spaced apart to have a predetermined interval without being connected to each other. Since each of the first low refractive pattern LRP1, the second low refractive pattern LRP2, and the third low refractive pattern LRP3 are spaced apart from each other, a portion of the upper surface of the bank BK may be exposed without being covered by the low refractive pattern LRP.

On the bank BK and the low refractive pattern LRP, the buffer layer BFL is disposed. The buffer layer BFL may include the organic buffer layer OL-1 and the inorganic buffer layer IOL-1.

The color filter layer CFL is disposed on the buffer layer BFL. The color filter layer CFL may include a plurality of color filters CF-R, CF-G, and CF-B, and the overcoat layer OC that covers the plurality of color filters CF-R, CF-G, and CF-B. Each of the plurality of color filters CF-R, CF-G, and CF-B transmits light of a specific wavelength range, and blocks light of a wavelength range other than the corresponding wavelength range. A first color filter CF-R overlapping the first pixel region PXA-R may transmit red light, and may block green light and blue light. A second color filter CF-G overlapping the second pixel region PXA-G may transmit green light, and may block red light and blue light. A third color filter CF-B overlapping the third pixel region PXA-B transmit blue light, and may block green light and red light. The plurality of the color filters CF-R, CF-G, and CF-B include a base resin and a dye and/or a pigment dispersed in the base resin. The base resin is a medium in which a dye and/or a pigment is dispersed, and may be formed of various resin compositions that may be commonly referred to as a binder.

The overcoat layer OC may be an organic layer that protects the plurality of the color filters CF-R, CF-G, and CF-B. The overcoat layer OC may include a photo-curable organic material or thermo-curable organic material. However, the embodiment described herein is not limited thereto. The overcoat layer OC may include an inorganic material.

Referring to FIG. 4 and FIG. 5 together, the bank well BW overlapping the bank well region BWA may be defined in the bank BK. The bank well BW may be defined spaced apart on a plane from the second opening OP2 (see FIG. 3A) in which each of the plurality of the color filters CF-R, CF-G, and CF-B is disposed.

The bank well BW may be formed by removing some regions of the bank BK in order to prevent defects caused by erroneous adhesion during a process of patterning the plurality of light control patterns CCF-R, CCF-G, and SCP included in the light control layer CCL. That is, the bank well BW is a portion into which incorrectly coated materials for forming the light control patterns CCF-R, CCF-G, and SCP may flow during the process of patterning the plurality of light control patterns CCF-R, CCF-G, and SCP. Through the bank well BW, it is possible to prevent the incorrectly coated materials for forming the light control patterns CCF-R, CCF-G, and SCP from remaining on an upper portion of the bank BK and causing defects during a forming process of an upper member.

The low refractive pattern LRP do not overlap the bank well region BWA in which the bank well BW is formed. That is, the low refractive pattern LRP may be patterned and formed to overlap the plurality of light control patterns CCF-R, CCF-G, and SCP, and not to overlap a portion in which the bank well BW is defined.

When a low refractive member for recycling light is formed on the plurality of light control patterns CCF-R, CCF-G, and SCP, if a low refractive material is formed to entirely overlap the pixel regions PXA-R, PXA-G, and PXA-B, the peripheral region NPXA, and the bank well region BWA, that is, if the low refractive member is formed as a low refractive layer forming one connected layer, the low refractive member is formed on the upper surface of the bank BK and inside the bank well BW. In this case, a step between the plurality of light control patterns CCF-R, CCF-G, and SCP and the bank BK disposed on a lower portion of the low refractive member may not be planarized, and when a portion of the low refractive member is formed inside the bank well BW, defects in which the low refractive member is broken or not formed in some regions may occur.

The low refractive pattern LRP according to an embodiment described herein is formed to overlap the upper portion of each of the plurality of light control patterns CCF-R, CCF-G, and SCP, and the low refractive patterns LRP disposed on the different light control patterns CCF-R, CCF-G, and SCP are disposed to be spaced apart from each other. In addition, the low refractive pattern LRP may be formed not to overlap a portion in which the bank well BW is defined. Accordingly, it is possible to prevent problems in which a step between the plurality of light control patterns CCF-R, CCF-G, and SCP and the bank BK is not planarized, and the low refractive member is broken or not formed in some desired regions, and thus, the reliability of the display panel DP may be improved.

Referring back to FIG. 4 and FIG. 5, a portion of the buffer layer BFL may be disposed inside the bank well BW. A color filter pattern CF-P may be disposed inside the bank well BW. The color filter pattern CF-P may include the same material as at least some of the plurality of color filters CF-R, CF-G, and CF-B included in the color filter layer CFL. That is, the color filter pattern CF-P may be formed through the same process when forming the plurality of color filters CF-R, CF-G, and CF-B included in the color filter layer CFL. In an embodiment, the color filter pattern CF-P may include a first color filter pattern CF-R1 including the same material as the first color filter CF-R, a second color filter pattern CF-G1 including the same material as the second color filter CF-G, and a third color filter pattern CF-B1 including the same material as the third color filter CF-B. At least one of the first color filter pattern CF-R1, the second color filter pattern CF-G1, or the third color filter pattern CF-B1 may be omitted in some implementations of the embodiment. For example, only one of the first color filter pattern CF-R1, the second color filter pattern CF-G1, and the third color filter pattern CF-B1 may be disposed inside the bank well BW. Alternatively, all of the first color filter pattern CF-R1, the second color filter pattern CF-G1, and the third color filter pattern CF-B1 may be omitted in some implementations of the embodiment. When all of the first color filter pattern CF-R1, the second color filter pattern CF-G1, and the third color filter pattern CF-B1 are omitted, a portion of the overcoat layer OC may be disposed inside the bank well BW. That is, without the first color filter pattern CF-R1, the second color filter pattern CF-G1, and the third color filter pattern CF-B1, an overcoat pattern OC-P, which is the portion of the overcoat layer OC, may fill the inside of the bank well BW.

FIG. 6A to FIG. 6D are cross-sectional views sequentially showing some steps of a method for manufacturing a display panel according to an embodiment. FIG. 7A to FIG. 7D are cross-sectional views sequentially showing some steps of a method for manufacturing a display panel according to an embodiment. In FIG. 6A to FIG. 6D, as in FIG. 4, some steps of a method for manufacturing a display panel are sequentially illustrated in a cross-section corresponding line II-II' of FIG. 2A. In FIG. 7A to FIG. 7D, as in FIG. 5, some steps of a method for manufacturing a display panel are sequentially illustrated in cross-sections corresponding line III-III' of FIG. 2A.

A method for manufacturing a display panel of an embodiment includes preparing a light emitting element, forming a plurality of light control patterns, forming a preliminary low refractive pattern layer, curing a low refractive pattern portion by irradiating with light, and removing a portion that is not cured.

Figures 6A, 6B:
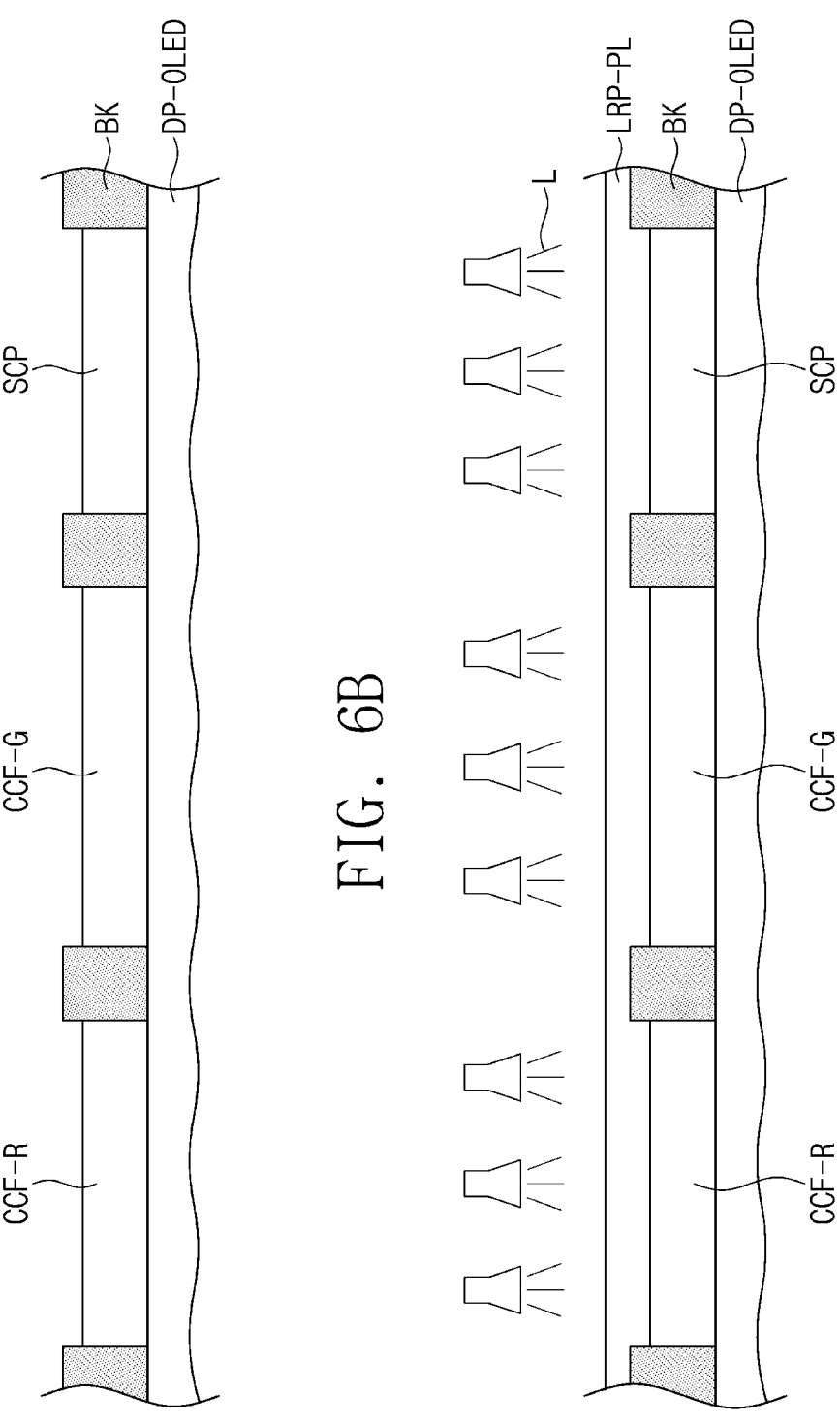
Figures 6C, 6D:
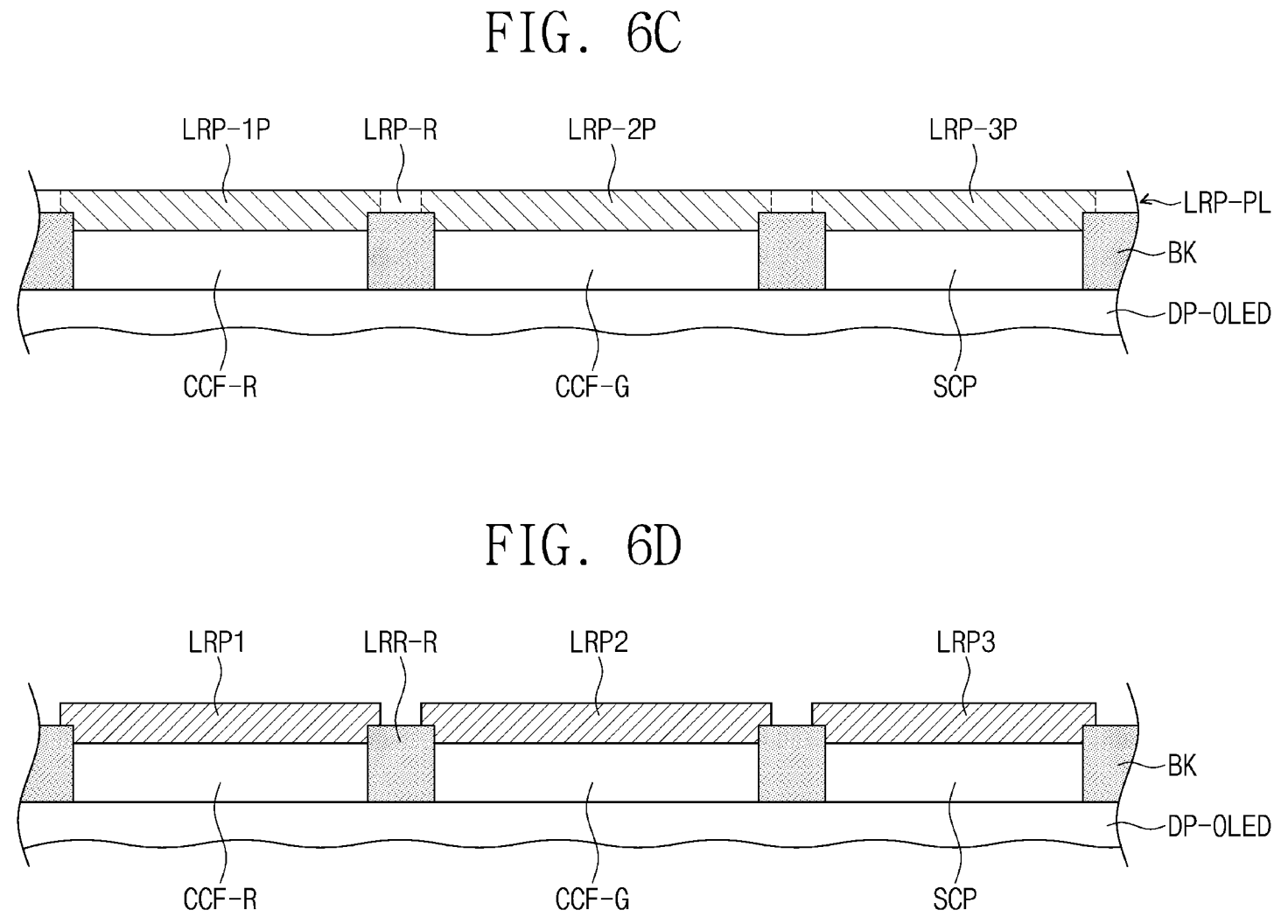

Referring to FIG. 6A and FIG. 6D, in the method for manufacturing a display panel of an embodiment, the display element layer DP-LED including the light emitting element OLED (see FIG. 4) is formed, and then the plurality of light control patterns CCF-R, CCF-G, SCP are formed on an upper portion of the display element layer DP-LED. The plurality of light control patterns CCF-R, CCF-G, and SCP may include the first light control pattern CCF-R, the second light control pattern CCF-G, and the transmissive pattern SCP. Each of the first light control pattern CCF-R, the second light control pattern CCF-G, and the transmissive pattern SCP may be spaced apart with the bank BK interposed therebetween. Each of the first light control pattern CCF-R, the second light control pattern CCF-G, and the transmissive pattern SCP may be patterned and formed in an opening defined in the bank BK.

Referring to FIG. 6B and FIG. 6C, in the method for manufacturing a display panel of an embodiment, the preliminary low refractive pattern layer LRP-PL is formed on the plurality of light control patterns CCF-R, CCF-G, and SCP to cover upper surfaces of the plurality of light control patterns CCF-R, CCF-G, and SCP. The preliminary low refractive pattern layer LRP-PL may be formed by coating a low refractive material. The low refractive material may be a material that forms the low refractive patterns LRP1, LRP2, and LRP3 (see FIG. 6D) having a refractive index of about 1.1 to about 1.4 after curing. The low refractive material may include the optical particles LP (see FIG. 3D) for lowing a refractive index, and the optical particles LP (see FIG. 3D) may include, for example, a porogen or hollow silica. The low refractive material may include a low refractive base resin that disperses optical particles. The low refractive material may further include a photo initiator that triggers a photocuring cross-linking chain reaction in response to ultraviolet light during a curing process to be described later.

Light L may be irradiated on a portion of the preliminary low refractive pattern layer LRP-PL, and thus, a photocuring reaction may be performed. In the method for manufacturing a display panel of an embodiment, a portion of the preliminary low refractive pattern layer LRP-PL which overlaps the plurality of light control patterns CCF-R, CCF-G, and SCP may be irradiated with the light L. The light L may be ultraviolet light.

Since the portion of the preliminary low refractive pattern layer LRP-PL that overlaps the plurality of light control patterns CCF-R, CCF-G, and SCP is irradiated with the light L, cured preliminary low refractive index patterns LRP-1P, LRP-2P, and LRP-3P may be formed in the preliminary low refractive pattern layer LRP-PL. The preliminary low refractive index patterns LRP-1P, LRP-2P, and LRP-3P may overlap the plurality of light control patterns CCF-R, CCF-G, and SCP, and may be spaced apart on a plane with an uncured pattern LRP-R interposed therebetween. The preliminary low refractive index patterns LRP-1P, LRP-2P, and LRP-3P may include a first preliminary low refractive pattern LRP-1P overlapping the first light control pattern CCF-R, a second preliminary low refractive pattern LRP-2P overlapping the second light control pattern CCF-G, and a third preliminary low refractive pattern LRP-3P overlapping the transmissive pattern SCP. Each of the first preliminary low refractive pattern LRP-1P, the second preliminary low refractive pattern LRP-2P, and the third preliminary low refractive pattern LRP-3P may disposed spaced apart from each other on a plane.

Referring to FIG. 6C and FIG. 6D, the method for manufacturing a display panel of an embodiment includes, after the photocuring step, removing the uncured pattern LRP-R that is not cured. The uncured pattern LRP-R is a portion that is not irradiated with the light L, and thus not cured, in the photocuring step, and may be defined between each of the first preliminary low refractive pattern LRP-1P, the second preliminary low refractive pattern LRP-2P, and the third preliminary low refractive pattern LRP-3P. Since the uncured pattern LRP-R is removed, the low refractive patterns LRP1, LRP2, and LRP3 may be formed on the upper portion of each of the plurality of light control patterns CCF-R, CCF-G, and SCP. The low refractive patterns LRP1, LRP2, and LRP3 may be spaced apart from each other on a plane. The low refractive patterns LRP1, LRP2, and LRP3 may include a first low refractive pattern LRP1 formed on the first light control pattern CCF-R, a second low refractive pattern LRP2 formed on the second light control pattern CCF-G, and a third low refractive pattern LRP3 formed on the transmissive pattern SCP, and the first low refractive pattern LRP1, the second low refractive pattern LRP2, and the third low refractive pattern LRP3 may be respectively spaced apart from each other on a plane.

Figure 7A:
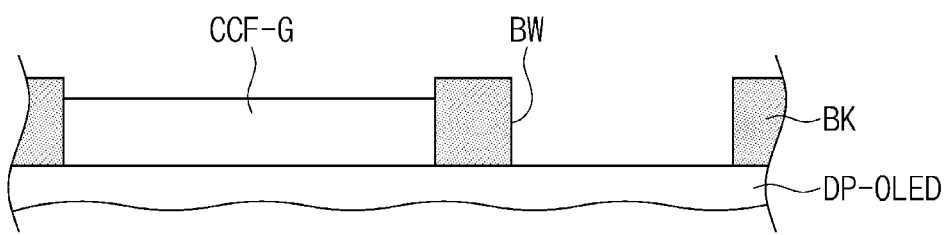
FIG. 7A to FIG. 7D are cross-sectional views sequentially showing some steps of a method for manufacturing a display panel according to an embodiment.
Figure 7B:
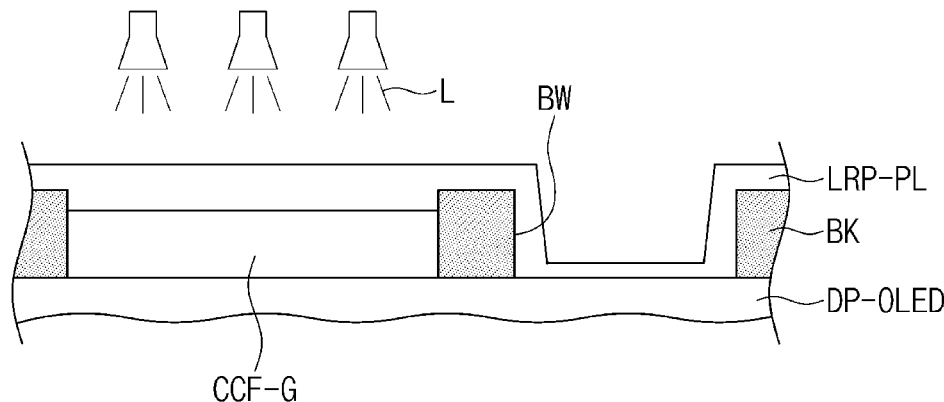

Referring to FIG. 7A and FIG. 7B, in the method for manufacturing a display panel of an embodiment, the bank well BW is formed in the bank BK to prevent erroneous adhesion defects during a process of forming the plurality of light control patterns CCF-R, CCF-G, and SCP, and when forming the preliminary low refractive pattern layer LRP-PL, a portion of the preliminary low refractive pattern layer LRP-PL may be disposed inside the bank well BW.

Figure 7C:
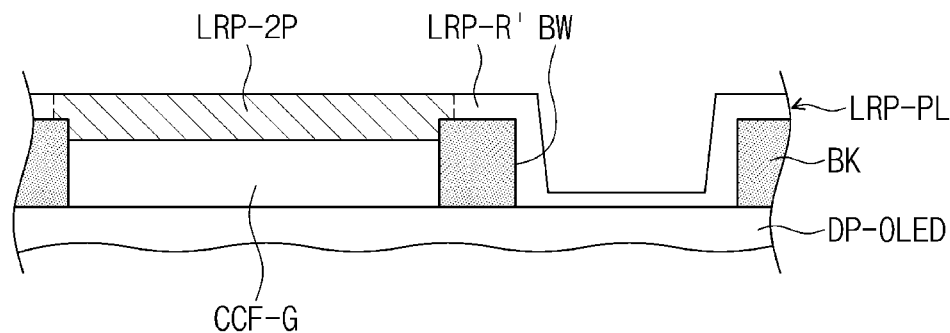

Referring to FIG. 7B and FIG. 7C, the light L may be irradiated on a portion of the preliminary low refractive pattern layer LRP-PL, and thus, a photocuring reaction may be performed, and the preliminary low refractive pattern layer LRP-PL disposed in a portion in which the bank well BW is defined may not be irradiated with the light L. The preliminary low refractive pattern layer LRP-PL disposed in the portion in which the bank well BW is defined may not be cured. The portion of the preliminary low refractive pattern layer LRP-PL that overlaps the plurality of light control patterns CCF-R, CCF-G, and SCP is irradiated with the light L, and thus, the preliminary low refractive index patterns LRP-1P, LRP-2P, and LRP-3P are formed, and the preliminary low refractive pattern layer LRP-PL disposed in the portion in which the bank well BW is defined is not cured, and thus, an uncured pattern LRP-R' may be formed.

Figure 7D:
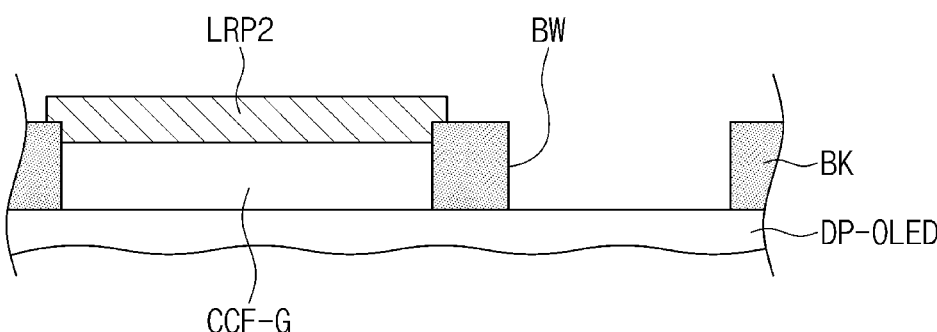

Referring to FIG. 7C and FIG. 7D, the method for manufacturing a display panel of an embodiment includes, after the photocuring step, removing the uncured pattern LRP-R' that is not cured. The uncured pattern LRP-R' disposed inside the bank well BW may be removed, and accordingly, the low refractive patterns LRP1, LRP2, and LRP3 may not be formed inside the bank well BW. That is, even after a forming process of the low refractive patterns LRP1, LRP2, and LRP3 is performed, the bank well may be exposed without having other components formed therein. In the following process, the buffer layer BFL (see FIG. 5), the color filter pattern CF-P (see FIG. 5), the overcoat pattern OC-P (see FIG. 5), and the like may be formed to be disposed inside the bank well BW.

According to a display panel of an embodiment, defects that may occur when a low refractive member for increasing light emitting efficiency of a light control pattern is formed as a single layer are prevented, so that a display panel with improved light emitting efficiency and improved reliability in a manufacturing process may be provided.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display panel comprising:
   a light emitting element that includes a first electrode, a light emitting layer disposed on the first electrode, and a second electrode disposed on the light emitting layer, and wherein the light emitting element outputs a source light;
   a light control layer disposed on the light emitting element, and that includes a plurality of light control patterns; and
   a plurality of low refractive patterns disposed on an upper portion of each of the plurality of light control patterns,
   wherein the plurality of light control patterns includes:
   a first light control pattern; and
   a second light control pattern spaced apart from the first light control pattern on a plane,
   the plurality of low refractive patterns includes:
   a first low refractive pattern disposed on the first light control pattern; and
   a second low refractive pattern disposed on the second light control pattern,
   wherein the first low refractive pattern and the second low refractive pattern are spaced apart from each other on a plane,
   at least a portion of each of the low refractive patterns is disposed on an upper surface of a bank, and
   an upper surface of the portion of each of the refractive patterns is disposed higher than the upper surface of the bank with respect to the light emitting element,
   wherein each of the plurality of low refractive patterns laterally overhangs its underlying light control pattern in every in-plane direction and extends onto the surrounding bank on all sides, but does not reach or overlap any neighboring light control pattern.

2. The display panel of claim 1, wherein a width of each of the plurality of low refractive patterns on a plane is greater than a width of each of corresponding light control patterns on a plane among the plurality of light control patterns.

3. The display panel of claim 2, wherein:
   the width of the first low refractive pattern in one direction is greater than the width of the first light control pattern in the one direction; and
   the width of the second low refractive pattern in the one direction is greater than the width of the second light control pattern in the one direction.

4. The display panel of claim 1, wherein the light control layer further comprises a bank that has an opening that is defined therein and in which each of the plurality of light control patterns is disposed.

5. The display panel of claim 4, wherein a bank well spaced apart from the opening on a plane is defined in the bank.

6. The display panel of claim 5, further comprising a color filter layer disposed on the plurality of low refractive patterns and including a plurality of color filters.

7. The display panel of claim 6, wherein the plurality of color filters comprise:

a first color filter at least a portion of which overlaps the first light control pattern; and a second color filter at least a portion of which overlaps the second light control pattern.

8. The display panel of claim 6, wherein a color filter pattern contains the same material as at least one of the plurality of color filters is disposed inside the bank well.

9. The display panel of claim 6, wherein the color filter layer further comprises an overcoat layer that covers the plurality of color filters.

10. The display panel of claim 9, wherein at least a portion of the overcoat layer is disposed inside the bank well.

11. The display panel of claim 1, wherein:

the light control layer further comprises a transmissive pattern spaced apart from the first light control pattern and the second light control pattern on a plane; and the plurality of low refractive patterns further comprise a third low refractive pattern disposed on the transmissive pattern.

12. The display panel of claim 1, wherein at least some of the plurality of light control patterns comprise quantum dots.

13. The display panel of claim 1, wherein each of the plurality of low refractive patterns comprises a porogen or hollow silica.

14. The display panel of claim 13, wherein each of the plurality of low refractive patterns further comprises a photocuring agent.

15. The display panel of claim 1, wherein each of the plurality of low refractive patterns has a refractive index of 1.1 to 1.4, and has a transmittance of 90% or greater.

16. The display panel of claim 1, wherein:

the source light is light of a first wavelength;

the first light control pattern converts the source light into light of a second wavelength that is different from the first wavelength; and the second light control pattern converts the source light into light of a third wavelength that is different from the first wavelength and the second wavelength.

17. The display panel of claim 16, wherein the light of the first wavelength is blue light, the light of the second wavelength is green light, and the light of the third wavelength is red light.

18. A display panel comprising:

a light emitting element;

a light control layer disposed on the light emitting element, and that includes a bank having a plurality of openings defined therein, and a plurality of light control patterns disposed inside each of the plurality of openings; and a plurality of low refractive patterns that are disposed on an upper portion of each of the plurality of light control patterns, and at least some of which are disposed inside the plurality of openings, wherein:

a bank well spaced apart from the opening on a plane is defined in the bank, the plurality of low refractive patterns do not overlap the bank well on a plane, at least a portion of each of the low refractive patterns is disposed on an upper surface of a bank, and an upper surface of the portion of each of the refractive patterns is disposed higher than the upper surface of the bank with respect to the light emitting element, wherein each of the plurality of low refractive patterns laterally overhangs its underlying light control pattern in every in-plane direction and extends onto the surrounding bank on all sides, but does not reach or overlap any neighboring light control pattern.

19. A method for manufacturing a display panel, the method comprising:

preparing a light emitting element that includes a first electrode, a light emitting layer disposed on the first electrode, and a second electrode disposed on the light emitting layer, and wherein the light emitting element outputs a source light;

forming, on the light emitting element, a first light control pattern and a second light control pattern spaced apart from the first light control pattern;

coating a low refractive material on the first light control pattern and the second light control pattern to provide a preliminary low refractive pattern layer;

irradiating and curing a portion of the preliminary low refractive pattern layer that overlaps each of the first light control pattern and the second light control pattern with light; and after the curing, removing a portion that is not cured, wherein at least a portion of each of the low refractive patterns is disposed on an upper surface of a bank, and an upper surface of the portion of each of the refractive patterns is disposed higher than the upper surface of the bank with respect to the light emitting element, wherein each of the plurality of low refractive patterns laterally overhangs its underlying light control pattern in every in-plane direction and extends onto the surrounding bank on all sides, but does not reach or overlap any neighboring light control pattern.

20. The method of claim 19, wherein, after the removing of a portion that is not cured, a first low refractive pattern overlapping the first light control pattern on a plane, and a second low refractive pattern overlapping the second light control pattern on a plane are formed; and the first low refractive pattern and the second low refractive pattern are spaced apart from each other on a plane.

* * * * *